United States Patent [19]
Kolluri

[11] Patent Number: 4,649,371
[45] Date of Patent: Mar. 10, 1987

[54] MULTI-STEP PARALLEL ANALOG-DIGITAL CONVERTER

[75] Inventor: Madhavprasad V. Kolluri, Santa Clara, Calif.

[73] Assignee: Signetics Corporation, Sunnyvale, Calif.

[21] Appl. No.: 580,410

[22] Filed: Feb. 15, 1984

[51] Int. Cl.[4] .................................. H03M 1/00
[52] U.S. Cl. ................................ 340/347 AD
[58] Field of Search ............... 340/347 AD, 347 DA, 340/347 M

[56] References Cited

U.S. PATENT DOCUMENTS

| | | | |
|---|---|---|---|
| 3,298,014 | 1/1967 | Stephenson | 340/347 AD |
| 3,597,761 | 8/1971 | Fraschilla | 340/347 AD |
| 3,935,569 | 1/1976 | Marcel et al. | 340/347 AD |
| 4,034,366 | 7/1977 | Memishian, Jr. | 340/347 DA |
| 4,196,420 | 4/1980 | Culmer et al. | 340/347 AD |
| 4,314,235 | 2/1982 | Ruf et al. | 340/347 AD |
| 4,400,689 | 8/1983 | Brokaw et al. | 340/347 DA |

OTHER PUBLICATIONS

*IBM Technical Disclosure Bulletin*, vol. 21, No. 8, Jan. 79, "A/D Converter".

Primary Examiner—Bernard Roskoski
Attorney, Agent, or Firm—Robert T. Mayer; Bernard Franzblau

[57] ABSTRACT

A multi-step A/D converter of the successive approximation type utilizes a single three-position switchable current-output DAC in combination with a voltage divider, a plurality of comparators, a decoder, a successive approximation register and a control logic module to provide a high speed, high resolution A/D converter requiring fewer parts than the prior art A/D converters of this general type.

18 Claims, 9 Drawing Figures

MULTI-STEP PARALLEL ANALOG-DIGITAL CONVERTER

BACKGROUND OF THE INVENTION

This invention relates to apparatus for converting an electric analog signal into a corresponding digital signal, and more particularly to a high speed, high resolution analog/digital converter especially useful in a data acquisition system.

There are numerous devices available for converting an analog quantity into a corresponding digital quantity. One of the early A/D conversion techniques is the full parallel A/D converter in which an analog input signal to be converted is applied in parallel to a plurality of comparators, each comparator being referenced to a potential derived from a resistor chain comprising a plurality of equal value resistors which divide down a reference voltage so as to derive a comparator reference level for each possible quantization level. For any level of analog input signal, all comparators referenced to quantization levels below the input signal will be actuated, whereas those comparators referenced to levels above the input signal level will not be actuated. The outputs of all of the comparators are applied to a logic decoder which yields the corresponding parallel output digital signal. This type of converter is very fast, but it is obviously also very expensive since, for an n-bit converter it requires $2^n-1$ comparators and a relatively large and complex decoder. A 10-bit A/D converter will require 1,023 comparators. Other disadvantages are that the power dissipation is very high and it exhibits a large input capacitance due to the large number of comparators connected to the input terminal.

Another approach to the A/D conversion problem is the successive approximation analog/digital converter, the basic theory of which is described at pages 407–408 of the IEEE Transactions on Circuits and Systems, Vol. CAS-25 No. 7, July 1978. In a successive approximation register (SAR) method, the analog input voltage may be converted to a current and in each clock cycle this current is compared in a comparator with one bit of current from a digital/analog converter (DAC), starting with the most significant bit (MSB) of current. The comparator output represents the corresponding output bit of the A/D converter. Thus, an analog signal is converted into an n-bit digital signal in n clock cycles. The advantages of this approach are that the converter requires far less components, e.g. only one comparator, and that the power dissipation is much lower than the all-parallel method. A major disadvantage is that the conversion process is much slower in that it requires at least n clock cycles for an n-bit digital signal output.

A modification of the SAR method is the subranging A/D converter. The theory underlying this type of converter is described at pages 20–22 of the Analog-Digital Conversion Handbook, copyright 1964 by the Digital Equipment Corp. of Maynard, Mass. FIG. 18 of this handbook shows a subranging converter including a resistor chain, a series of comparators each with one input connected to the analog signal input terminal and second inputs connected to respective equally spaced tap points on the resistor chain. It also includes first and second DAC's connected respectively to the upper and lower ends of the resistor chain and a parallel decoder coupled to the outputs of the comparators. The subranging method operates by dividing the total input signal range into a number of subranges, selecting the appropriate subrange by means of the comparators and resistor chain, and then dividing this subrange into further subranges as before, and repeating the process until the desired resolution is achieved.

During a first clock cycle, the first DAC is set to the maximum voltage and the second DAC is set to zero. The outputs of the comparators indicate in which subrange the input signal falls, e.g. between the reference voltages applied to two adjacent comparators $C_k$ and $C_{k+1}$. During the next clock cycle, the reference voltage for comparator $C_k$ is applied to the second DAC and the reference voltage for comparator $C_{k+1}$ is applied to the first DAC so as to produce a second set of subranges between the values of the reference voltages for $C_k$ and $C_{k+1}$. This is repeated until the desired resolution is obtained. A more sophisticated form of subranging A/D converter is shown in U.S. Pat. No. 3,298,014 in the name of B. W. Stephenson. A major disadvantage of these subranging A/D converters is that they require two digital/analog converters, which increases the size and cost of the apparatus, and presents additional problems in that the two DAC's must be accurately matched.

SUMMARY OF THE INVENTION

In view of the foregoing, it is an object of this invention to provide an analog/digital converter that overcomes the disadvantages of the known converters.

Another object of the invention is to provide a subranging A/D converter that uses only a single DAC to convert an analog input into a digital output.

A further object of the invention is to provide a smaller and more efficient A/D converter that maintains a constant load on a source of reference voltage.

A still further object of the invention is to provide a general purpose, high speed, high resolution A/D converter that uses a multi-step parallel conversion process.

The foregoing objects are achieved in accordance with the invention by utilizing a single novel three-position-switchable current-output DAC in a sub-ranging type of A/D converter. In a preferred embodiment of the invention an analog quantity is converted into a corresponding digital quantity by quantizing two bits per clock cycle by means of a parallel encoder.

A further advantage of the invention is that a single array of comparators and a single resistor chain (voltage divider) is used during each successive parallel conversion step, thereby further simplifying the apparatus and reducing its cost and size.

BRIEF DESCRIPTION OF THE DRAWINGS

The foregoing and other objects and advantages of the invention will become apparent upon consideration of the following detailed description of a preferred embodiment thereof, when read in conjunction with the accompanying drawings, in which.

DESCRIPTION OF THE PREFERRED EMBODIMENT

Figure 1:
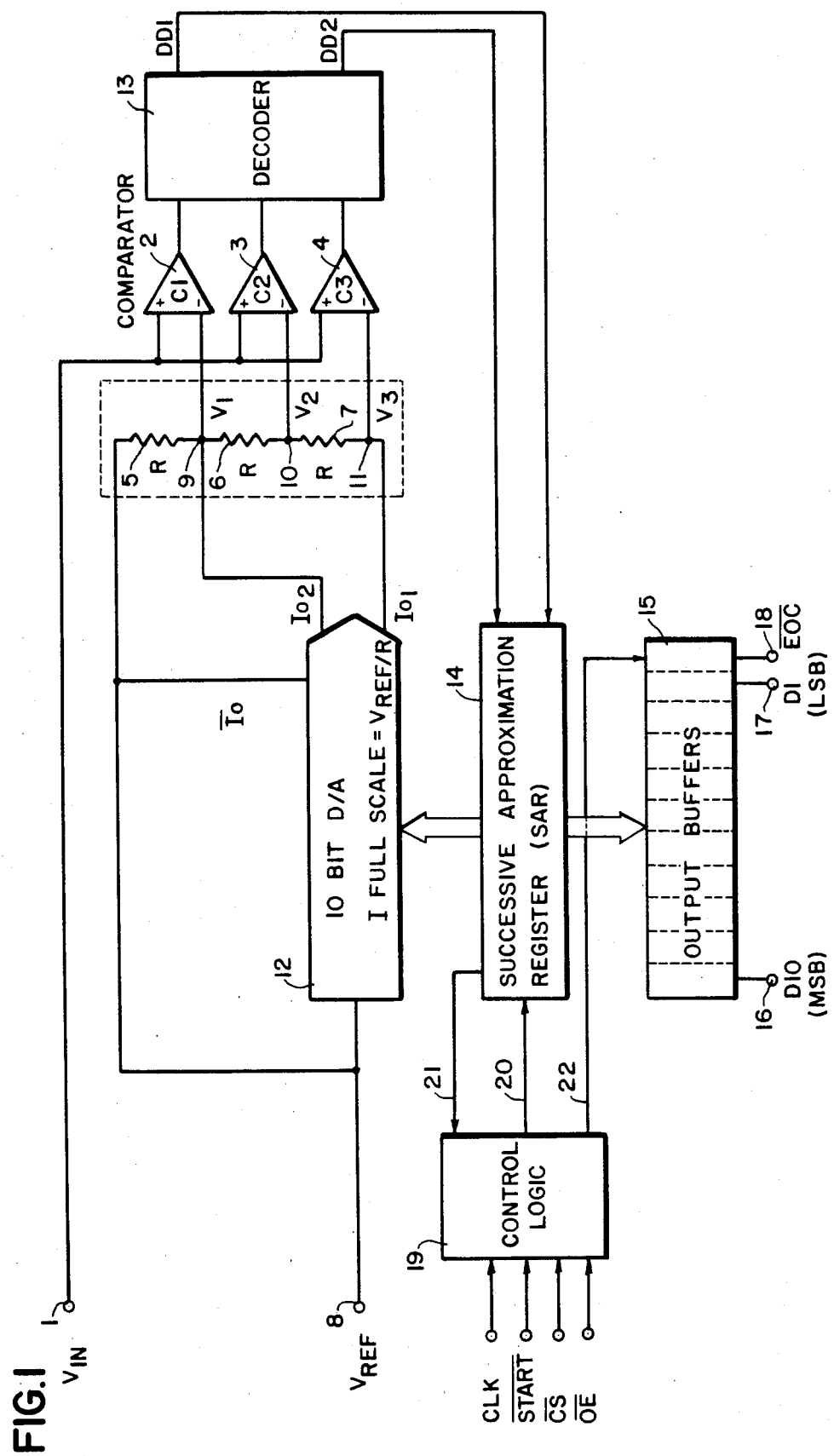
FIG. 1 is a block diagram of a preferred embodiment of the invention.

FIG. 1 shows a block diagram of the new multi-step parallel A/D converter utilizing a single three-position-switchable current output DAC. An input terminal 1 is provided for receiving an analog input voltage to be converted into a corresponding digital signal, e.g. a 10-bit digital representation. First, second and third comparators 2, 3 and 4, respectively, have their non-inverting (+) inputs connected to input terminal 1. A resistor chain (voltage divider) consistino of three equal value resistors 5, 6 and 7 is connected at one end to a terminal 8 adapted to receive a reference voltage ($V_{ref}$).

The resistor chain 5–7 has tap points 9, 10 and 11 connected to the inverting (−) inputs of comparators 2, 3 and 4, respectively. A ten-bit three-position-switchable current output digital/analog converter 12 has a first terminal connected to a junction point between resistor 5 and terminal 8 at which a current $\bar{I_0}$ can be switched. The DAC 12 has a second terminal for a switchable current $I_{02}$ connected to tap point 9 on the resistor chain and a third terminal for a switchable current $I_{01}$ connected to tap point 11. This maintains a constant load on the source of reference voltage.

The comparators 2, 3 and 4 have output lines connected to inputs of a decoder 13. The decoder converts the comparator outputs into a ten-bit digital representation thereof two bits at a time, starting with the two MSB's designated $D_{10}$ and $D_9$. Thus, the analog input signal is quantized two bits at a time in the parallel decoder 13 during each step of a conversion cycle. Each pair of bits appear on the decoder output lines designated $DD_1$ and $DD_2$.

In the present embodiment, in each step the total input signal range is divided into four subranges which provide two data bits on output lines $DD_1$ and $DD_2$. Thus, an analog input voltage is converted into its digital representation in five steps of a conversion cycle. In each step, the subrange containing the input voltage is selected. In each succeeding step the selected subrange is further divided into smaller subranges until the desired resolution is achieved.

The two data bits on decoder output lines $DD_1$ and $DD_2$ are applied to a successive approximation register (SAR) 14, the operation of which will be described in greater detail below. The SAR 14 is a modified form of the SAR that is used in a conventional SAR type A/D converter. It includes a shift register, data latches and decoding circuitry. The shift register in SAR 14 provides the proper timing sequence for latching the data from the decoder into the data latches, which in turn directly drive the output buffers 15. The shift register and data latch outputs are decoded by means of AND gates so as to control the switches in the DAC 12. The digital output signal appears at the output terminals of the output buffers 15. Only two of the ten output terminals are shown, i.e. terminal 16 for the MSB (D10) and terminal 17 for the LSB (D1). A further output terminal 18 provides a logic signal $\overline{EOC}$ which signals the end of a conversion cycle.

The operation of the analog/digital converter is controlled by means of a control logic module 19 which in turn is controlled by four microprocessor derived digital input control signals labeled CLK, $\overline{START}$, $\overline{CS}$ and $\overline{OE}$. The CLK input is the system clock connection for synchronizing the various elements of the converter. The operation of the converter is initiated by the $\overline{START}$ pulse, i.e. the negative going edge of this pulse initiates a conversion cycle. A high voltage level at the $\overline{CS}$ input inhibits the system from responding to the $\overline{START}$ pulse. A low level voltage at input $\overline{OE}$ enables the output buffers, whereas a high voltage level forces the output buffers into a three-state (high impedance) condition. The control logic 19 generates a pair of control signals SPA and SPB which are applied to the SAR 14 over control lines 20 to initiate a conversion cycle. The control logic also receives a signal over line 21 from the SAR, and in turn provides a signal over line 22 to the $\overline{EOC}$ buffer unit in output buffer 15 so as to indicate the end of a conversion cycle.

In one embodiment of my invention I use a DC supply voltage of +5V and −5V and a reference voltage, $V_{ref}$, of 2.5V. On receipt of an external $\overline{START}$ signal, the control logic resets the A/D converter to an initial condition. Each of the resistors 5, 6 and 7 are of equal value, R. Initially, i.e. in the reset state, the two MSB currents (bits 10 and 9) of the DAC 12 are switched to the current line $\bar{I_0}$, the current in the line $I_{01}$ of DAC 12 is, $$I_{01} = \frac{V_{ref}}{4R},$$

and the current in the line $I_{02} = 0$. The derivation of these currents will be explained in detail below in connection with the individual system modules. The current which then flows through the resistor chain 5–7 produces voltage drops across the equal resistors such that the voltage levels at tap points 9, 10 and 11 are $$V_1 = \frac{3V_{ref}}{4},$$

$$V_2 = \frac{V_{ref}}{2} \text{ and}$$

$$V_3 = \frac{V_{ref}}{4},$$

respectively. In other words, the current flowing in the resistor chain produces a voltage drop across each resistor of $\frac{1}{4}$ of the total range of the A/D converter, i.e. a voltage drop of $V_{ref}/4$ appears across each of the resistors 5–7.

Let us assume that the input analog voltage, $V_{in}$, at terminal 1 is at a level between the reference voltage levels $V_1$ and $V_2$ as shown in the Table below. For example, assume $V_{in}$ is 1.761V. With a reference voltage, $V_{ref} = 2.5V$, then $$V_1 = \frac{3(2.5)}{4} = 1.875 \text{ V}$$

at tap point 9 on the resistor chain voltage divider, $$V_2 = \frac{2.5}{2} = 1.25 \text{ V}$$

at tap point 10, and $$V_3 = \frac{2.5}{4} = 0.625 \text{ V}$$
at tap point 11. The resistance R of each of the resistors 5–7 is 625 Ohms.
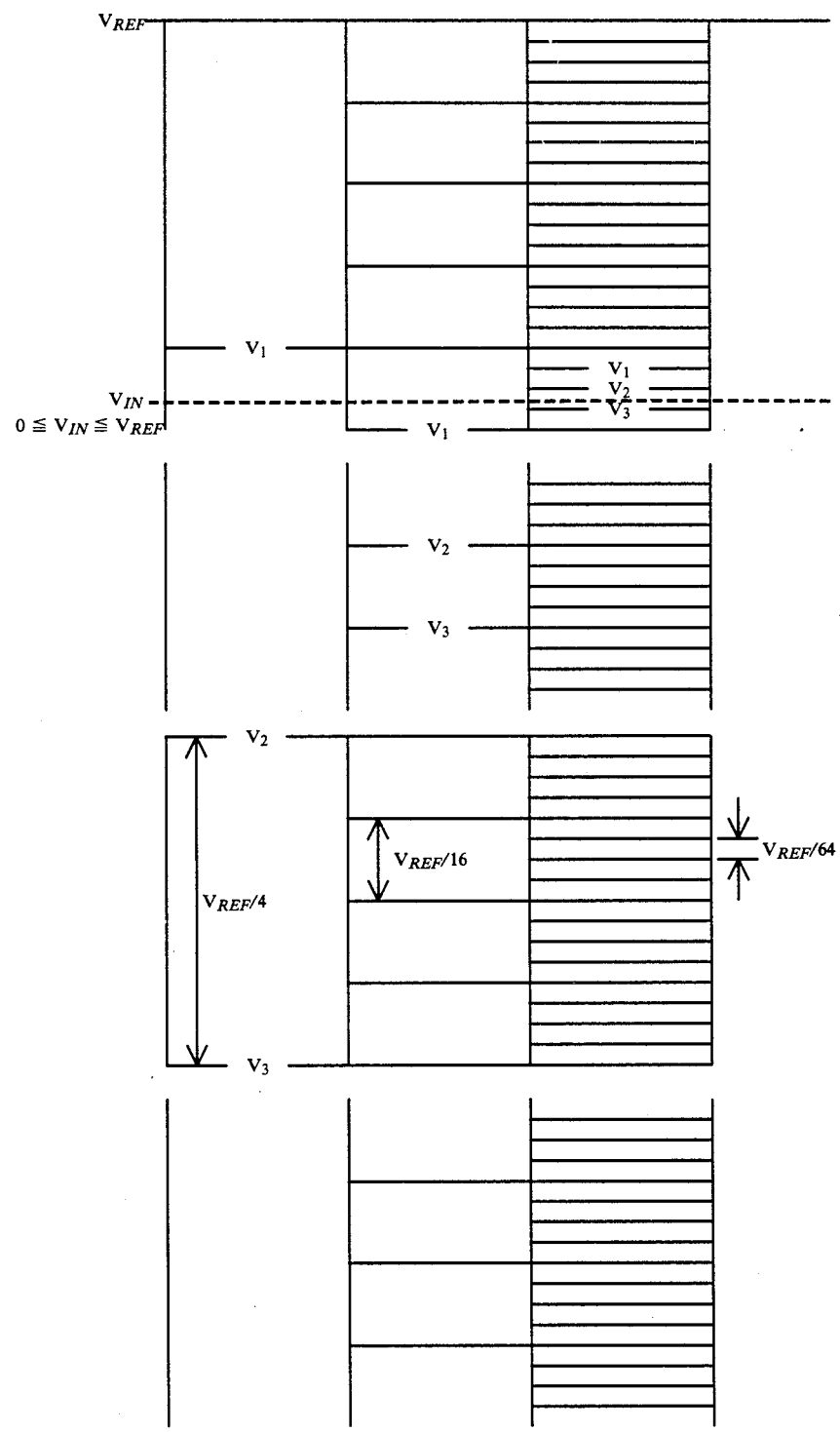

-continued
CONVERSION TABLE

0 V⎯

| STEP I | STEP II | STEP III | STEPS |
|---|---|---|---|
| $I_{01} = V_{REF}/4\,R$ | $I_{01} = V_{REF}/16\,R$ | $I_{01} = V_{REF}/64\,R$ | IV & V |
| $I_{02} = 0$ | $I_{02} = V_{REF}/4\,R$ | $I_{02} = V_{REF}/4\,R$ | are |
| $V_1 = 3\,V_{REF}/4$ | $V_1 = 4\,V_{REF}/16$ | $V_1 = 47\,V_{REF}/64$ | similar |
| $V_2 = V_{REF}/2$ | $V_2 = 10\,V_{REF}/16$ | $V_2 = 46\,V_{REF}/64$ | |
| $V_3 = V_{REF}/4$ | $V_3 = 9\,V_{REF}/16$ | $V_3 = 45\,V_{REF}/64$ | |
| $DD_1 = D_{10} = \text{``1''}$ | $DD_1 = D_8 = \text{``1''}$ | $DD_1 = D_6 = \text{``0''}$ | |
| $DD_2 = D_9 = \text{``0''}$ | $DD_2 = D_7 = \text{``1''}$ | $DD_2 = D_5 = \text{``1''}$ | |

The analog input voltage, $V_{in}$ is compared with these three voltage levels by the latching comparators 2–4 (positive edge triggered). The decoder 13 then converts the comparator outputs into the first two data bits, i.e. the two MSB's $D_{10}$ and $D_9$, which appear on output lines $DD_1$ and $DD_2$, respectively of the decoder. During the first step of the conversion cycle, the input voltage is located within one of four sub-ranges, i.e. $V_{in}$ will be located either between 0V and $$V_3\left(\frac{V_{ref}}{4}\right),\ V_3 \text{ and } V_2\left(\frac{V_{ref}}{2}\right),\ V_2 \text{ and } V_1\left(\frac{3V_{ref}}{4}\right),$$

or $V_1$ and $V_{ref}$. In the example assumed, $V_{in}$ has been located as being in the subrange between voltage levels $V_1$ and $V_2$, i.e. between $$\frac{3V_{ref}}{4} \text{ and } \frac{V_{ref}}{2},$$

shown in the Table. A binary "1" signal appears at decoder output line $DD_1$ and a binary "0" signal appears at output line $DD_2$. These two MSB data bits are latched into the successive approximation register 14 on the following negative edge of the clock signal. Thus, the first conversion step has selected one of the four subranges. At the same time, the SAR 14 transfers the two MSB's thus derived, $D_{10}$ and $D_9$, to the $D_{10}$ and $D_9$ output buffers, where they are stored.

In order to determine the next two bits ($D_8$ and $D_7$) of the digital signal, it is necessary to expand the previously determined subrange into four smaller subranges separated by equally spaced voltage levels lying between the previously determined voltage levels $V_1$ and $V_2$. During the next (second) step of the conversion cycle, the switches in the DAC 12 are controlled by SAR 14 to cause currents of bits 8 and 7 of DAC 12 to switch from the current line $I_{01}$ to the current line $\overline{I_0}$, thereby decreasing $I_{01}$ to $V_{ref}/16R$, i.e. to a value $\frac{1}{4}$ of its value during the first step. This causes the voltage drops across each of the resistors 5–7 to be $V_{ref}/16$.

Also the complement of data bits $D_{10}$ and $D_9$ determined in the first step are now switched to current line $I_{02}$ of DAC 12, i.e. $I_{02} = \overline{D_{10}} \times I_{10} + \overline{D_9} \times I_9$. In the example chosen, since it was determined that $D_{10} = 1$ and $D_9 = 0$; $I_{02} = 0 \times I_{10} + 1 \times I_9 = I_9 = V_{ref}/4R$. The current $I_{02}$ causes an additional voltage drop of $V_{ref}/4$ across resistor 5.

The combined effect of $I_{01}$ and $I_{02}$ is to set $V_1$ at tap point 9 to a value of $V_1 = V_{ref} - V_{ref}/16 - V_{ref}/4 = 11V_{ref}/16$, which is below the top of the selected subrange by a value of $V_{ref}/16$. The voltage drop of value $V_{ref}/16$ occurring across resistors 6 and 7 due to $I_{01}$ develops voltages at tap points 10 and 11, respectively, of $V_2 = 11V_{ref}/16 - V_{ref}/16 = 10V_{ref}/16$ and $V_3 = 10V_{ref}/16 - V_{ref}/16 = 9V_{ref}/16$. In other words, the previously determined subrange, bounded by $V_{ref}/2$ and $3V_{ref}/4$ has been divided into four smaller subranges by setting the voltages at tap points 9, 10 and 11 to $V_1 = 11V_{ref}/16$, $V_2 = 10V_{ref}/16$ and $V_3 = 9V_{ref}/16$.

As in step 1, the comparators and the decoder determine the next two data bits, $D_8$ and $D_7$, of the digital output signal corresponding to the analog input voltage, $V_{in}$. At the end of step 2, decoder output lines $DD_1$ and $DD_2$ each produce a binary "1" signal (see the Table) for the assumed value of $V_{in}$.

This process is repeated for steps 3, 4 and 5 to determine the remaining data bits, $D_6$ and $D_5$ (step 3), $D_4$ and $D_3$ (step 4), and $D_2$ and $D_1$ (step 5). In each successive step a smaller subrange is selected so as to successively converge towards $V_{in}$. The Table illustrates the first three steps of the conversion cycle for the assumed value of $V_{in}$ and shows the output currents of DAC 12, the voltages at the tap points on the resistor chain ($V_1$, $V_2$ and $V_3$), and the output data bits of the decoder 13 ($DD_1$ and $DD_2$). The current in current line $\overline{I_0}$ is: $\overline{I_0} = I_{FS} - I_{01} - I_{02}$, where $I_{FS}$ (i.e. $I_{full}$ scale) of DAC 12 is $V_{ref}/R$.

Figure 2:
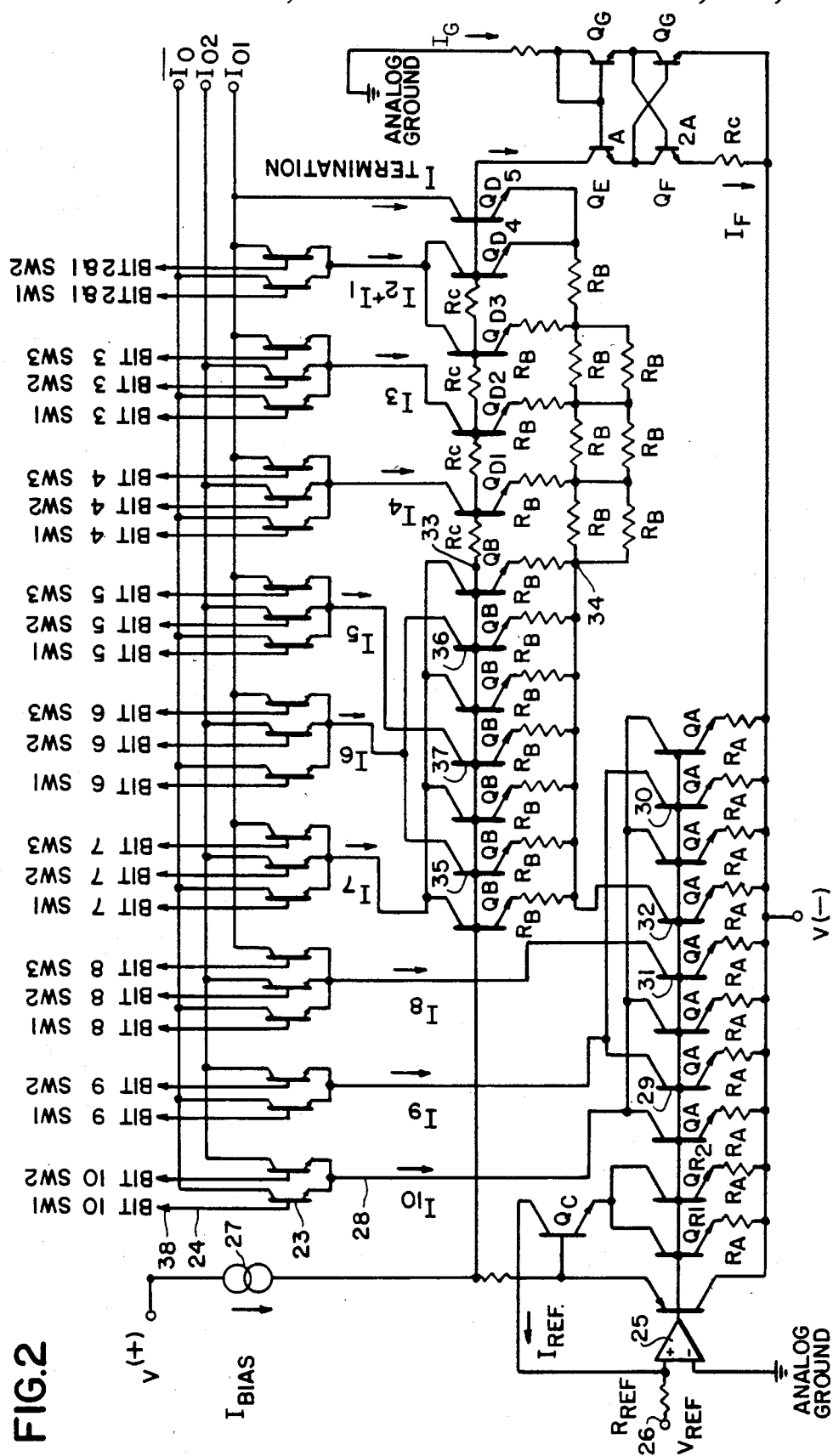
FIG. 2 is a schematic diagram of the D/A converter 12 of FIG. 1.

The digital/analog converter 12 will now be described in greater detail with reference to FIG. 2. The DAC consists of two levels of interleaved, equal value current sources that generate the six MSB's, $D_{10}$–$D_5$. The technique of interleaving current sources is used to statistically average the errors due to component matching and thereby improve the accuracy. The first level includes the eight transistors $Q_A$ and the second level includes the seven transistors $Q_B$. The transistors $Q_A$ form seven interleaved equal valued current sources connected in a 4:2:1 ratio to generate the three MSB currents $I_{10}$, $I_9$ and $I_8$ of the DAC 12. The eighth current source, transistor 32, is connected to the second level of seven intervleaved equal valued current sources, transistors $Q_B$, also connected in a 4:2:1 ratio to generate the next three current bits, $I_7$, $I_6$ and $I_5$. The last four bit currents ($I_4$–$I_1$) of the DAC are generated by a so-called R/2R ladder that includes the four transistors $Q_{D1}$–$Q_{D4}$ and the ladder network of resistors $R_B$. The individual bit currents are selectively connected to the three output current lines $I_{01}$, $I_{02}$ or $\overline{I_0}$, by means of three position switches consisting of differential amplifiers 23 that are switched between the on and off states under the control of signals received from SAR 14 via the control lines 24.

The DAC includes a circuit for shifting the voltage level to provide the required base voltages for the transistors $Q_A$, $Q_B$ and $Q_{D1}$–$Q_{D5}$ of the current sources.

This circuit includes a reference control amplifier 25, e.g. a conventional op-amp such as the µA 741, having its inverting (−) input connected to analog ground and its non-inverting input (+) coupled via a resistor, $R_{ref}$ ($R_{ref}=4R$), to an input terminal 26 for the voltage $V_{ref}$. Transistors $Q_c$, $Q_{R1}$ and $Q_{R2}$ form a negative feedback loop between the output of reference control amplifier 25 and its non-inverting input. A bias current source 27 provides bias current for the various transistors, e.g. transistors $Q_c$, $Q_B$ etc.

Under steady state conditions the negative feedback loop of amplifier 25 forces the positive (non-inverting) input terminal of the amplifier to be at a potential very close to the negative (inverting) input terminal thereof, which, as shown, is at analog ground potential. The current flowing through resistor $R_{ref}$ is therefore $V_{ref}/R_{ref}$. The input bias current of the amplifier is negligibly small so that the collector current of transistor $Q_c$ is also $V_{ref}/V_{ref}$. Neglecting any base currents, the collector currents of transistors $Q_{R1}$ and $Q_{R2}$ are each equal to $V_{ref}/2R_{ref}$. It can therefore be said that the reference control amplifier drives the bases of the transistors $Q_{R1}$ and $Q_{R2}$ so that their collector currents are each equal to $V_{ref}/2R_{ref}$.

All of the transistors $Q_A$ are identical to the transistors $Q_{R1}$ and $Q_{R2}$ and each transistor also has an equal valued resistor $R_A$ connected in its emitter lead. The transistors are all driven with the same base potential so that the collector current of each of these transistors is also equal to $V_{ref}/2R_{ref}$.

The collectors of four of the transistors $Q_A$ are connected together forming a current source which provides a current $I_{10}$ in the line 28 equal to $$4 \times \frac{V_{ref}}{2R_{ref}} = \frac{2V_{ref}}{R_{ref}}.$$

This current $I_{10}$ forms the MSB (bit 10) current source.

Similarly, the two $Q_a$ transistors 29 and 30 together form the next MSB (bit 9) current source, $$I_9 = \frac{V_{ref}}{R_{ref}}.$$

A single transistor 31 forms the third MSB (bit 8) current source $$I_8 = \frac{V_{ref}}{2R_{ref}}.$$

The current in the remaining $Q_A$ transistor 32 *is fed to the network composed of transistors $Q_B$* connected in parallel and followed by an R/2R ladder network.

It can be shown that the network to the right of the circuit points labeled 33 and 34, including the five transistors $Q_{D1}$–$Q_{D5}$ and the ladder network including resistors $R_B$, is equivalent to a single transistor $Q_B$ with a resistor $R_B$ connected in its emitter lead. The overall circuit in the second level is therefore equivalent to eight transistors $Q_B$ with eight respective emitter resistors $R_B$. Thus, it can be seen that the collector current flowing through each of the transistors $Q_B$ is one-eighth of the current fed by the collector of the $Q_A$ transistor 32. Therefore, the collector current of each of the transistors labeled $Q_B$ is equal to $V_{ref}/16R_{ref}$.

The collectors of four of the transistors $Q_B$ are connected together to form the fourth MSB (bit 7) current source so that $$I_7 = \frac{4V_{ref}}{16R_{ref}} = \frac{V_{ref}}{4R_{ref}}.$$

Similarly, the two $Q_B$ transistors 35 and 36 together form the bit 6 current source, $$I_6 = \frac{V_{ref}}{8R_{ref}}.$$

A single $Q_B$ transistor 37 forms the bit 5 current source, $$I_5 = \frac{V_{ref}}{16R_{ref}}.$$

The network shown to the right of circuit points 33 and 34 is a R-2R ladder network which is typical of that used in many D/A converters. The current flowing into node 34 is divided in a binary fashion through each of the transistors.

Thus, the following currents flow in the collector circuits of the transistors $Q_{D1}$–$Q_{D5}$:

Bit 4 = collector current of $Q_{D1} = I_4 = \dfrac{V_{ref}}{32R_{ref}}$

Bit 3 = collector current of $Q_{D2} = I_3 = \dfrac{V_{ref}}{64R_{ref}}$

Bit 2 = collector current of $Q_{D3} = I_2 = \dfrac{V_{ref}}{128R_{ref}}$

Bit 1 = collector current of $Q_{D4} = I_1 = \dfrac{V_{ref}}{256R_{ref}}$ $I_{termination}$ = collector current of $Q_{D5} = I_T = \dfrac{V_{ref}}{256R_{ref}}$.

The transistors labeled $Q_{D1}$ through $Q_{D5}$ are identical to the transistors labeled $Q_B$. The collector currents flowing through transistors $Q_{D1}$–$Q_{D5}$ is not the same as the current flowing through transistor $Q_B$. The ratio of the currents flowing through the transistors is as follows:

$$\frac{I_c(Q_B)}{I_c(Q_{D1})} = \frac{I_c(Q_{D1})}{I_c(Q_{D2})} = \frac{I_c(Q_{D2})}{I_c(Q_{D3})} = \frac{I_c(Q_{D3})}{I_c(Q_{D4})} = 2$$

Since the current densities in the transistors differ by a factor of 2, the base/emitter voltage, $V_{BE}$, of these transistors will be different by a factor of $$\frac{kT \ln 2}{q}.$$

This could create errors in the binary weighting of the currents. One solution to this problem is to include resistors $R_c$ in the base circuits of the transistors, as shown in FIG. 2. A voltage drop of $$\frac{kT \ln 2}{q}$$

is generated across the resistors which appears between the bases of the transistors. This compensates for the $V_{BE}$ difference due to the current densities being different by a factor of two.

If a current equal to $$\frac{\frac{kT}{q} \ln 2}{R_c}$$

flows through these resistors, it will create a voltage drop equal to $$\frac{kT \ln 2}{q}$$

between the bases of the transistors. This will correct for the unequal values of $V_{BE}$ due to unequal current densities of the transistors.

The circuit for generating the current $$\frac{\frac{kT}{q} \ln 2}{R_c}$$

is composed of transistors $Q_E$, $Q_F$ and the two identical transistors labeled $Q_G$. The emitter area of transistor $Q_F$ is twice the emitter area of transistor $Q_E$. Hence, the saturation current of transistor $Q_F$ is twice the saturation current of transistor $Q_E$, i.e. $I_S(Q_F) = 2I_S(Q_E)$. Neglecting base currents, the collector current of the two transistors labeled $Q_G$ is the same. Therefore, their $V_{BE}$ is the same. Applying Kirchhoff's voltage law:

$$V_{BE}(Q_E) + V_{BE}(Q_G) = I_F R_c + V_{BE}(Q_F) + V_{BE}$$

$$V_{BE}(Q_E) - V_{BE}(Q_F) \, 32 \, I_F R_C$$

Since the collector currents of QE and QF are the $$\frac{kT}{q} \ln \frac{I_c(Q_E)}{I_s(Q_E)} - \frac{kT}{q} \ln \frac{I_c(Q_F)}{I_s(Q_F)} = I_F R_c$$

$$\frac{kT}{q} \ln \frac{I_c(Q_E)}{I_s(Q_E)} \times \frac{I_s(Q_F)}{I_c(Q_F)} = I_F R_c$$

$$\frac{kT}{q} \ln \frac{I_s(Q_F)}{I_s(Q_E)} = I_F R_c$$

$$\frac{kT}{q} \ln 2 = I_F R_c; \text{ wherefore } I_F = \frac{\frac{kT}{q} \ln 2}{R_c}$$

The following Table summarizes the individual bit currents. The specific values shown are for a reference voltage, $V_{ref}=2.5V$ and $R_{ref}=2.5$ Kohms, where $R_{ref}=4R$.

Table of Current Bit Values $I_{ref}$ = Reference Current = $\frac{V_{ref}}{R_{ref}}$ = 1 mA $I_{10}$ = Bit 10 Current = $\frac{2 V_{ref}}{R_{ref}}$ = 2 mA $I_9$ = Bit 9 Current = $\frac{V_{ref}}{R_{ref}}$ = 1 mA -continued
Table of Current Bit Values $I_8$ = Bit 8 Current = $\frac{V_{ref}}{2 R_{ref}}$ = .5 mA $I_7$ = Bit 7 Current = $\frac{V_{ref}}{4 R_{ref}}$ = .25 mA $I_6$ = Bit 6 Current = $\frac{V_{ref}}{8 R_{ref}}$ = .125 mA $I_5$ = Bit 5 Current = $\frac{V_{ref}}{16 R_{ref}}$ = .0625 mA $I_4$ = Bit 4 Current = $\frac{V_{ref}}{32 R_{ref}}$ = .03125 mA $I_3$ = Bit 3 Current = $\frac{V_{ref}}{64 R_{ref}}$ = .015625 mA $I_2$ = Bit 2 Current = $\frac{V_{ref}}{128 R_{ref}}$ = .0078125 mA $I_1$ = Bit 1 Current = $\frac{V_{ref}}{256 R_{ref}}$ = .00390625 mA $I_{termination}$ = R-2 R Termination Current = $\frac{V_{ref}}{256 R_{ref}}$ = .00390625 mA The bit currents $I_{10}$, $I_9$ and $I_2+I_1$ are each connected to the emitters of respective groups of two of the transistors 23. All of the remaining bit currents, $I_3$ through $I_8$, are each connected to the emitters of respective groups of three transistors 23. The transistors 23 function as switches under control of the output signals of the SAR 14 and which are applied to the base electrodes thereof via the input terminals 38 and the lines 24. The transistors 23 selectively divert the bit currents to the output lines $\overline{I_0}$, $I_{01}$ and $I_{02}$ of the DAC 12 under control of the SAR 14, which in turn is controlled by the resistor chain, the comparators and the decoder 13. In any step of a conversion cycle, nine transistors of the total array of transistors 23 will be turned on, but only one transistor 23 in each of the nine groups of transistors will be turned on. For example, if the middle transistor 23 of the bit 8 current line is turned on, the other two transistors connected to line $I_8$ are cut-off so that the bit 8 current, $I_8$, only flows in the output line $I_{02}$.

In the first step of a conversion cycle, the left-hand transistors 23 of current bits 10 and 9 are turned on so that the output line $\overline{I_0}$ carries a current, $\overline{I_0}=I_9+I_{10}=-1ma+2ma=3ma$ for the values $V_{ref}=2.5V$ and $R_{ref}=2.5K$. At the same time, the right-hand transistors 23 of each group of three transistors connected to current bit lines I3 through $I_8$ are turned on so that bit currents $I_3-I_8$ flow in output line $I_{01}$. Similarly, the right-hand transistors 23 of the pair of transistors connected to bit line $I_2+I_1$ is turned on so this current too flows in output line $I_{01}$. The termination current $I_t$ from transistor $Q_{D5}$ also flows in output line $I_{01}$. The output line $I_{02}$ carries no current in step 1 of the conversion cycle. This will set the voltages on the voltage divider 5, 6 and 7 as follows $$V_1 = \frac{3V_{ref}}{4},$$

$$V_2 = \frac{V_{ref}}{2} \text{ and}$$

-continued $$V_3 = \frac{V_{ref}}{4},$$

respectively.

With these values the A/D converter will determine the two MSB's (bit 10 and bit 9) of the digital signal that corresponds to the analog input voltage. For the example assumed above, $D_{10}=1$ and $D_9=0$.

Having determined the two MSBs of the A/D conversion process in the first step, the voltages $V_1$, $V_2$ and $V_3$ on the voltage divider must now be changed in step two to a new set of values to determine the next two bits, bit 8 and bit 7, of the digital signal. Using the same example as before, since the analog input voltage falls between $\frac{3}{4} V_{ref}$ and $\frac{1}{2} V_{ref}$, the voltages are $$V_1 = \frac{11V_{ref}}{16}, V_2 = \frac{10V_{ref}}{16} \text{ and } V_3 = \frac{9V_{ref}}{16}.$$

Regardless of the analog input voltage, the voltage drop across resistors 6 and 7 of the resistor chain is $V_{ref}/16$ during the second step of a conversion cycle, i.e. $\frac{1}{4}$ of its value in the previous step (step 1).

As described above in connection with FIG. 1, during the second step the SAR 14 switches the current bits $I_8$ and $I_7$ of DAC 12 from output line $I_{01}$ to output line $\overline{I_0}$, thereby decreasing $I_{01}$ to $V_{ref}/16R$ to which causes the voltage drop across each resistor of the resistor chain to be the aforesaid $V_{ref}/16$. In step 2 the SAR 14 turns off the right hand transistors of each group of three transistors 23 connected to current bit lines $I_8$ and $I_7$ and turns on the left hand transistors thereof so that bit currents $I_8$ and $I_7$ now flow in output line $\overline{I_0}$. The current in output line $I_0 = D_{10} \times I_{10} + D_9 \times I_9 + I_8 + I_7 = 1 \times I_{10} + 0 \times I_9 + I_8 + I_7 = I_{10} + I_8 + I_7 = 2 + 0.5 + 0.25 = 2.75$ma. The left hand transistor of the pair of transistors 23 connected to current bit line $I_{10}$ stays on, and the right hand transistor stays off.

At the same time, the complement of bits $D_{10}$ and $D_9$ determined in step 1 are switched to output line $I_{02}$, i.e.

$$I_{02} = \overline{D_{10}} \times I_{10} + \overline{D_9} \times I_9 = 0 \times I_{10} + 1 \times I_9 =$$

$$I_9 = \frac{V_{ref}}{4R} \left( \text{i.e. } \frac{2.5 \text{ V}}{2.5 \text{ K}} = 1 \text{ mA} \right).$$

Thus, the right hand transistor of the pair of transistors 23 connected to current bit line $I_9$ is switched on, and the left hand transistor of this pair is switched off. In addition, output current line $I_{01}$ now carries the current bits $I_1$ through $I_6 + I_{terminmation}$ ($I_{01} = I_1 + I_2 \ldots + I_6 + I_T$). As in step 1, the right hand transistors of each group of three transistors 23 connected to current lines $I_3$ through $I_6$ stay on, as does the right hand transistor of the pair of transistors 23 connected to current bit line $I_2 + I_1$.

In summary, for step 2, $\overline{I_0} = I_{10} + I_8 + I_7$; $I_{01} = I_1 + I_2 \ldots I_6 + I_T$; and $I_{02} = I_9$. As in the first step, the comparators 2-4 and the decoder 13 determine the values of the two bits, $D_8$ and $D_7$, which for the assumed example are $D_8 = 1$ and $D_7 = 1$. The currents $I_{01}$ and $I_{02}$ set the voltages $V_1$, $V_2$ and $V_3$ at tap points 9, 10 and 11, respectively, of the resistor chain 5-7 to the values:

$$\frac{11V_{ref}}{16}, \frac{10V_{ref}}{16} \text{ and } \frac{9V_{ref}}{16},$$

respectively. The conversion process described is repeated for steps 3, 4 and 5 to determine the remaining bits, $D_1 – D_6$, two bits per step. In each consecutive step, a narrower voltage subrange is selected so as to successively converge towards the value of $V_{in}$.

In each successive step, $I_{01}$ is reduced to $\frac{1}{4}$ of its previous value (e.g.

$$\left( \text{e.g. } I_{01} = \frac{V_{ref}}{64 R} \text{ in step 3} \right).$$

in step 3). The current $I_{02}$ is determined by the data bits derived in the earlier steps. The DAC bit currents that flow in line $I_{02}$ are those for which the corresponding derived output bit has been determined to be a zero during all of the previous steps in a conversion cycle.

Figure 3:
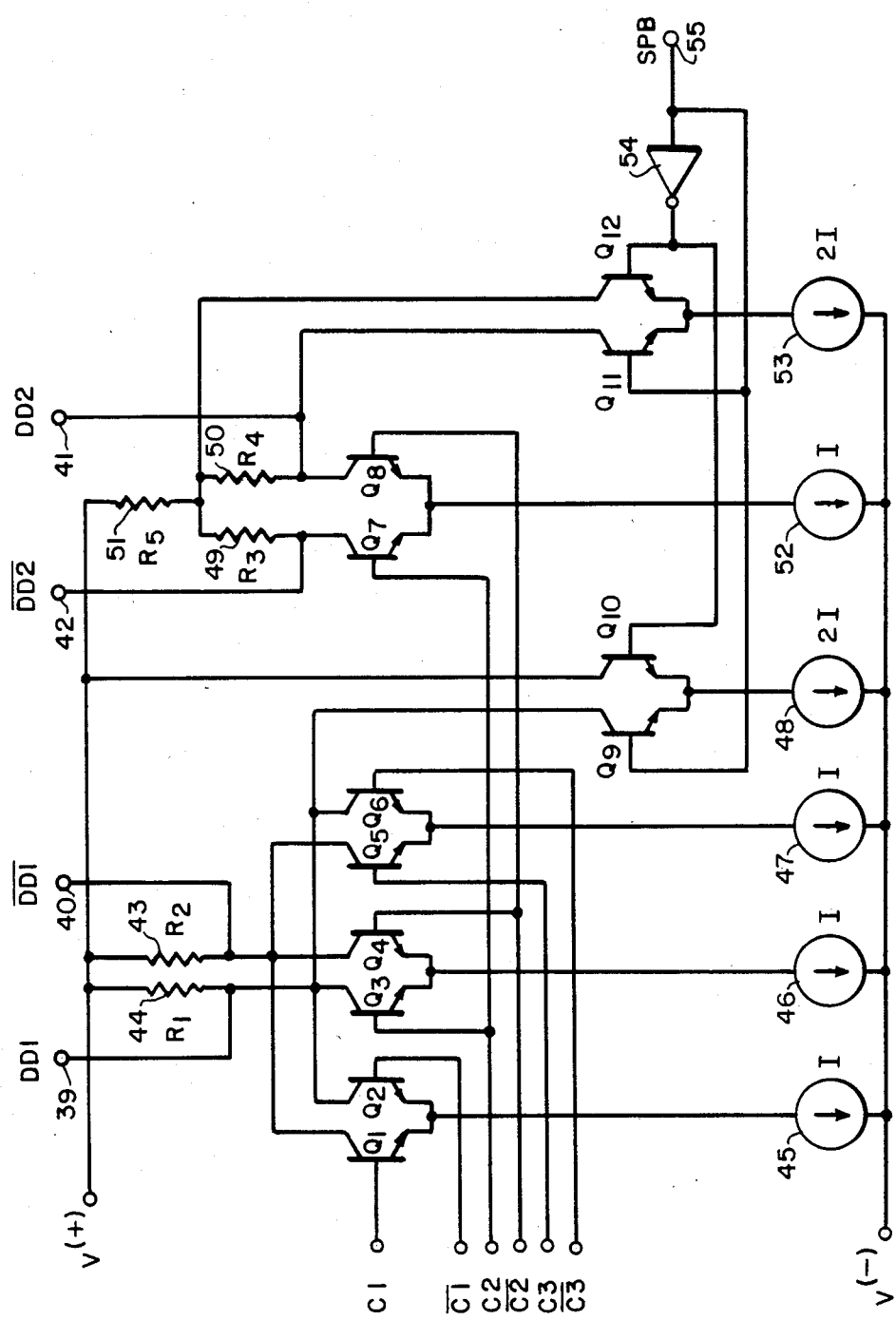
FIG. 3 is a schematic diagram of the decoder of FIG. 1.

FIG. 3 illustrates in schematic form a simplified version of the decoder 13. The output lines from the comparators 2 ($C_1$, $\overline{C_1}$), 3 ($C_2$, $\overline{C_2}$) and 4 ($C_3$, $\overline{C_3}$) are connected to the base electrodes of respective ones of three differential amplifiers composed of transistors $Q_1–Q_2$, $Q_3–Q_4$ and $Q_5–Q_6$. The output lines $C_2$, $\overline{C_2}$ from comparator 3 are also connected to respective base electrodes of a differential amplifier composed of transistors $Q_7$ and $Q_8$. The MSB of each pair of bits decoded appears at decoder output lines 39 ($DD_1$) and 40 ($\overline{DD_1}$), whereas the LSB appears at output terminals 41 ($DD_2$) and 42 ($\overline{DD_2}$).

The collector electrodes of transistors $Q_1$, $Q_4$ and $Q_5$ are connected together and via a resistor 43 to the positive supply voltage terminal $V(+)$. The collector electrodes of transistors $Q_2$, $Q_3$ and $Q_6$ are connected together and via a resistor 44 to the positive DC voltage $V(+)$. Output terminal 39 is connected to the lower end of resistor 44 and output 40 is connected to the lower end of resistor 43.

The emitter electrodes of transistors $Q_1$ and $Q_2$ are directly connected together and via a current source 45 to the negative DC voltage supply terminal, $V(-)$. Similarly, the emitters of transistors $Q_3$ and $Q_4$ are connected together and via a current source 46 to the supply terminal $V(-)$. The connected emitters of transistors $Q_5$ and $Q_6$ are coupled via current source 47 to the negative supply voltage terminal. Each of the current sources 45, 46 and 47 suoply identical currents, I. In view of the collector connections shown, either a current I or a current 2I will flow through resistors 43 and 44 thus creating a differential output signal. A differential signal can be used to signify a logic state.

The transistors $Q_9$, $Q_{10}$, $Q_{11}$ and $Q_{12}$ perform the reset function. The collector of transistor $Q_9$ is connected to the junction point between resistor 44 and the collectors of transistors $Q_2$, $Q_3$ and $Q_6$, while the collector of transistor $Q_{10}$ is directly connected to the positive DC supply voltage terminal $V(+)$. The emitters of $Q_9$ and $Q_{10}$ are connected together and via a current source 48 to the negative supply terminal $V(-)$.

The collector electrodes of transistors $Q_7$ and $Q_8$ are connected via respective resistors 49 and 50 and a common resistor 51 to the positive terminal $V(+)$. Output terminal 41 for the $DD_2$ data bit is connected to a junction point between resistor 50 and the collector electrodes of transistors $Q_8$ and $Q_{11}$, while output terminal 42 ($\overline{DD_2}$) is connected to a junction point between resistor 49 and the collector of transistor $Q_7$.

The collector of transistor $Q_{12}$ is connected to a junction point between resistors 49, 50 and 51. The emitters of $Q_7$ and $Q_8$ are connected together and via a current source 52 to the negative DC supply terminal, while the emitters of $Q_{11}$ and $Q_{12}$ are similarly connected together and via a current source 53 to said negative terminal. The current sources 48 and 53 each supply a current 2I and the current source 52 provides a current I.

The base electrodes of transistors $Q_{10}$ and $Q_{12}$ are connected together and to the output of an inverting amplifier 54. The input of amplifier 54 is connected to an input terminal 55 which receives a signal SPB from the control logic module 19. The base electrodes of transistors $Q_9$ and $Q_{11}$ are connected to input terminal 55.

The decoder of FIG. 3 operates in accordance with the following Truth Table:

TRUTH TABLE

| SPB | $C_1$ | $C_2$ | $C_3$ | DD1 | DD2 |
|---|---|---|---|---|---|
| 0 | 1 | 1 | 1 | 1 | 1 |
| 0 | 0 | 1 | 1 | 1 | 0 |
| 0 | 0 | 0 | 1 | 0 | 1 |
| 0 | 0 | 0 | 0 | 0 | 0 |
| 1 | x | x | x | 0 | 0 |

As long as the SPB signal received at terminal 55 from SAR 14 is high, an additional current 2I flows through resistor 44 via transistor $Q_9$ and current source 48. Similarly, an additional current 2I flows through resistor 50 via transistor $Q_{11}$ and current source 53. This forces the DD1 and DD2 outputs of the decoder into a low state. The Truth Table indicates that there can be only four possible combinations of the output states of the comparators 2-4, due to the way they are connected in the circuit.

For the assumed input voltage $V_{in}$ discussed above, during step 1 the comparators 3 ($C_2$) and 4 ($C_3$) each produce a logic "1" output, whereas comparator 2 ($C_1$) produces a logic "0" output. This is because $V_{in}$ falls between the voltage levels $V_1$ (tap 9) and $V_2$ (tap 10) of the voltage divider 5-7. The Truth Table shows that the output lines $DD_1$ and $DD_2$ of the decoder now provide a logic "1" and a logic "0" signal, respectively (also see step 1 in the conversion table).

Referring to step 2 in the conversion table, it can be seen that $V_{in}$ falls within the uppermost of the four voltage levels so that all three comparators produce a logic "1" output, i.e. the top line of the Decoder Truth Table now prevails. Therefore, decoder output lines DD1 32 1 and DD2 32 1, which is the same as was described earlier and as shown in the conversion table under step 2. The third and fourth data bits, $D_8$ and $D_7$, are each a logic "1" and are stored in output buffer 15. A similar analysis will confirm that the last six data bits derived in steps 3-5 of the conversion cycle will produce the following values: $D_6=0$ and $D_5=1$ (step 3); $D_4=0$ and $D_3=0$ (step 4); and $D_2=0$ and $D_1=1$ (step 5).

Figure 4:
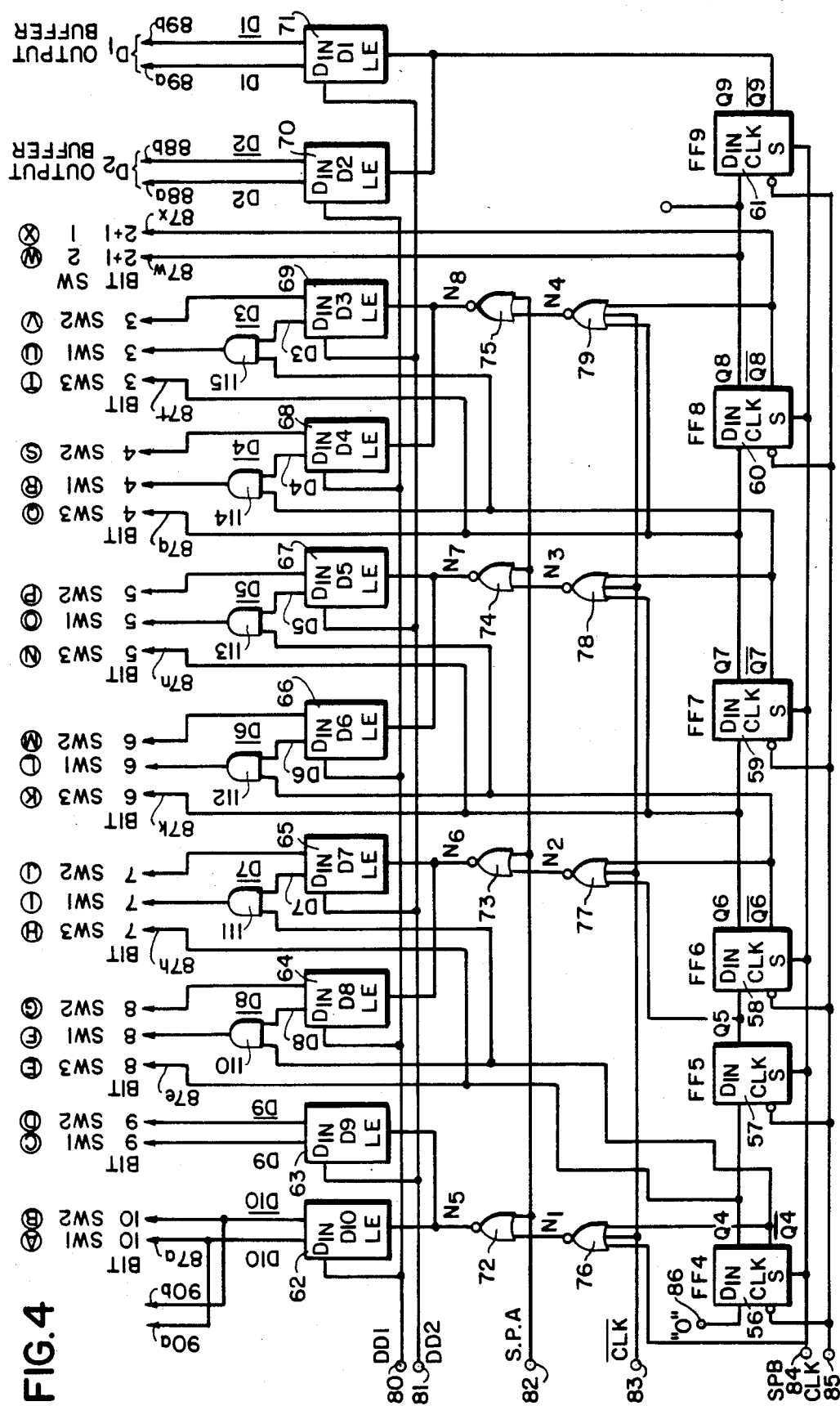
FIG. 4 is a block diagram of the successive approximation of FIG. 1.

A diagram of the successive approximation register (SAR) 14 is shown in FIG. 4. It comprises a 6-stage shift register made up of D-type flip-flops 56-61 and ten data latch flip-flops 62-71. The D-flip-flops 56-61 are negative edge triggered. If the Set input is at a logic 0, the Q outputs will attain the same logic state that was present at the D-input just prior to the clock signal going from logic 1 to logic 0. At all other times, the D-input has no effect on the Q-output. A logic 1 at the Set input of the D-flip-flop forces the Q-output to be a logic 1 regardless of the state of the clock and D-input.

The data latch flip-flops 62-71 are fall through type flip flops, which means that as long as the LE input is a logic 0, the D-output of the latch will attain the same logic state that is present at the D-input. When the LE input is a logic 1, the D-output of the latch will retain the logic state that it was in just prior to the LE input going from logic 0 to logic 1. The D-output of the latch does not change as long as the LE input is a logic 1 regardless of any changes in the D-input.

The SAR also includes decoding circuitry consisting of NOR gates 72-79 and AND gates 110-115. The SAR is controlled by input signals at input terminals 80 and 81 for the DD1 and DD2 output signals of decoder 13, and at terminals 82, 83, 84 and 85 by the control logic output signals SPA, $\overline{CLK}$, SPB and CLK, respectively.

The D-input terminal of flip-flop 56 is permanently connected to a terminal 86 at which a logic "0" signal is maintained. The output terminals 87a through 87x (only certain ones of said terminals being labeled) provide the control signals that are applied to the base electrodes of switching transistors 23 of DAC 12 via the DAC input terminals 38 (FIG. 2). The pair of data bits DD1 and DD2 from decoder 13 appearing at input terminals 80 and 81 are latched into data latch flipflops 62-71. The data latch outputs $D_{10}$–$D_1$ directly drive the output buffers. The connections to the output buffers are only shown for data bits $D_{10}$ (terminals 90a, 90b), $D_2$ (terminals 88a, 88b) and $D_1$ (terminals 89a, 89b). Output terminals 88a, 88b and 89a, 89b and 90a, 90b couple these data bits to respective stages $D_{10}$, $D_2$ and $D_1$ of the output buffer 15.

The SPA signal at terminal 82 is coupled to one input of each of the NOR gates 72-75. A second input of the NOR gates 72-75 is connected to a respective output of the NOR gates 76-79. One input of each of the three-input NOR gates 76-79 is coupled to terminal 83 which receives the $\overline{CLK}$ signal from the control logic module 19.

The SPB signal appearing at terminal 84 is connected to the Set input terminals of shift register flipflops 56-61 and the CLK signals at terminal 85 are coupled to the clock input terminals of the flipflops. The $\overline{Q}$ outputs of flipflops 56, 58, 59 and 60 are connected to respective second inputs of NOR gates 76, 77, 78 and 79, respectively. The Q outputs of flipflops 57, 58 and 59 are coupled to third inputs of NOR gates 77, 78 and 79, respectively. The SPB terminal 84 is coupled to a third input of NOR gate 76.

The output of NOR gate 72 is connected to the LE input of data latch flipflops 62 and 63. Similarly, the respective outputs $N_6$, $N_7$ and $N_8$ of NOR gates 73, 74 and 75 are connected to LE inputs of data latch flipflops 64-65, 66-67, and 68-69, respectively. The D-inputs of data latch flipflops 62, 64, 66, 68 and 70 are coupled to input terminal 80 (DD1 bit), whereas the D-inputs of data latch flipflops 63, 65, 67, 69, and 71 are coupled to input terminal 81 (DD2 bit).

One input of the AND gates 110-115 is connected to a respective D output of the data latch flipflops 64-69. A second input of AND gates 110 and 111 is each connected to the $\overline{Q}$ output of flipflop 56. Similarly, second inputs of AND gates 112, 113 are connected to the $\overline{Q}$ output of flipflop 58 and second inputs of AND gates 114, 115 are connected to the $\overline{Q}$ output of flipflop 59.

In addition, the Q output of flipflop 56 is connected to output terminals 87e and 87h of the SAR 14, the Q output of flipflop 58 is connected to output terminal 87k and 87n, the Q output of flipflop 59 is connected to output terminal 87q and 87t, and the Q output of flipflop 60 is connected to output terminal 87w and the $\overline{Q}$ output of flip-flop 60 is connected to output terminal 87x. The Q outputs of flipflops 56–60 are successively connected to the D inputs of flipflops 57–61. The $\overline{Q}$ output of flipflop 61 is coupled to the LE inputs of data latch flipflops 70 and 71.

Figure 5A:
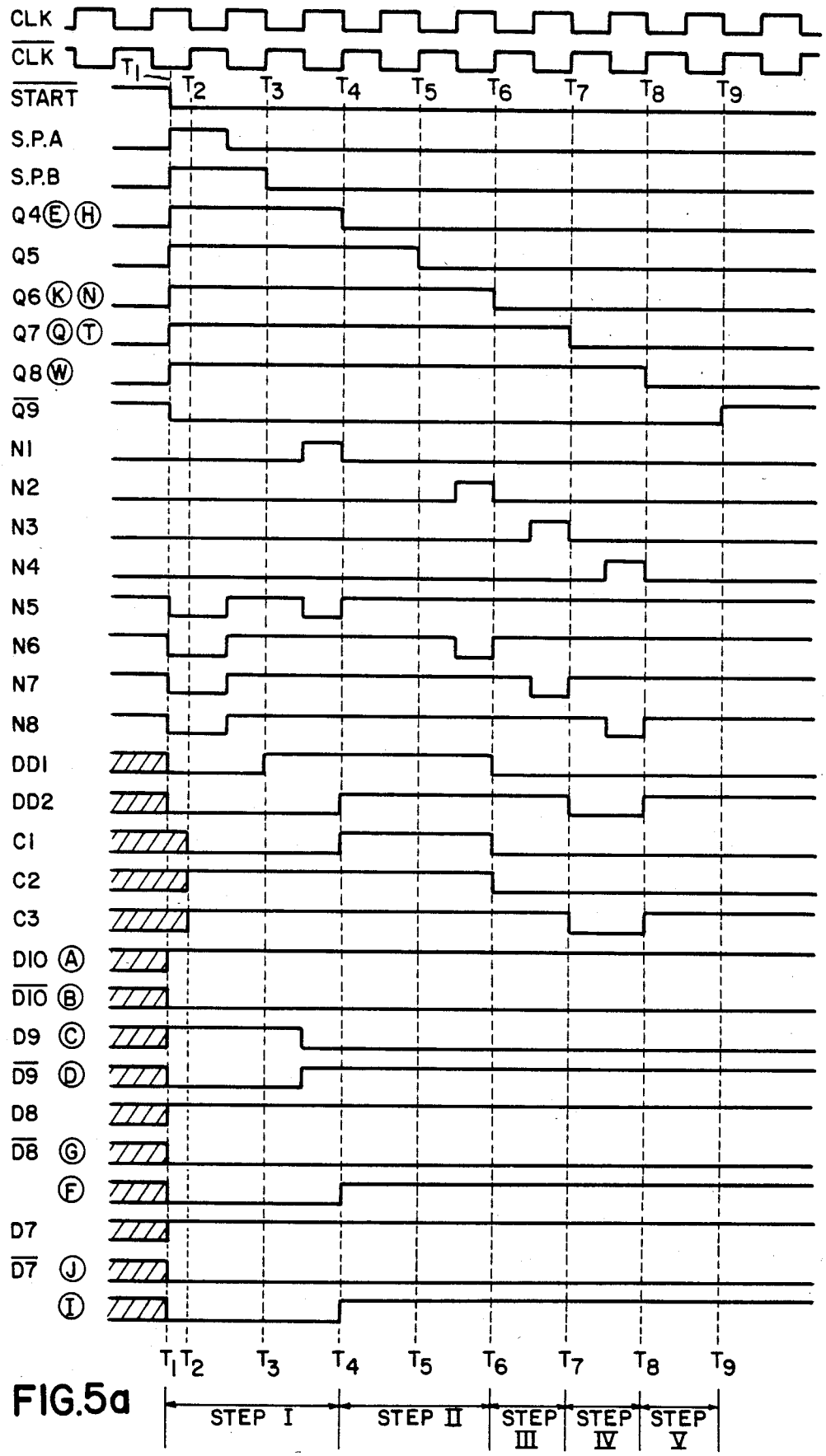
FIGS. 5A, 5B, 5C are a timing waveform diagram illustrating the operation of the SAR of FIG. 4.
Figure 5B:
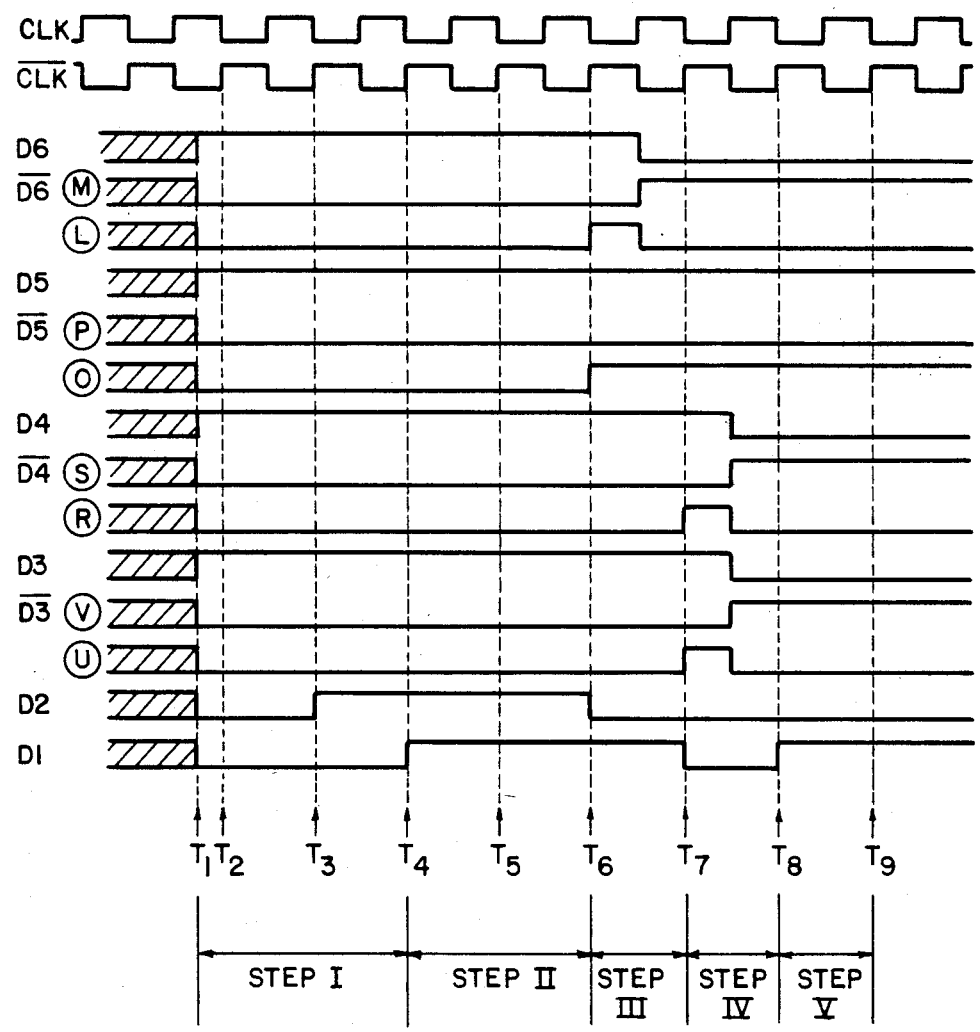
Figure 5C:
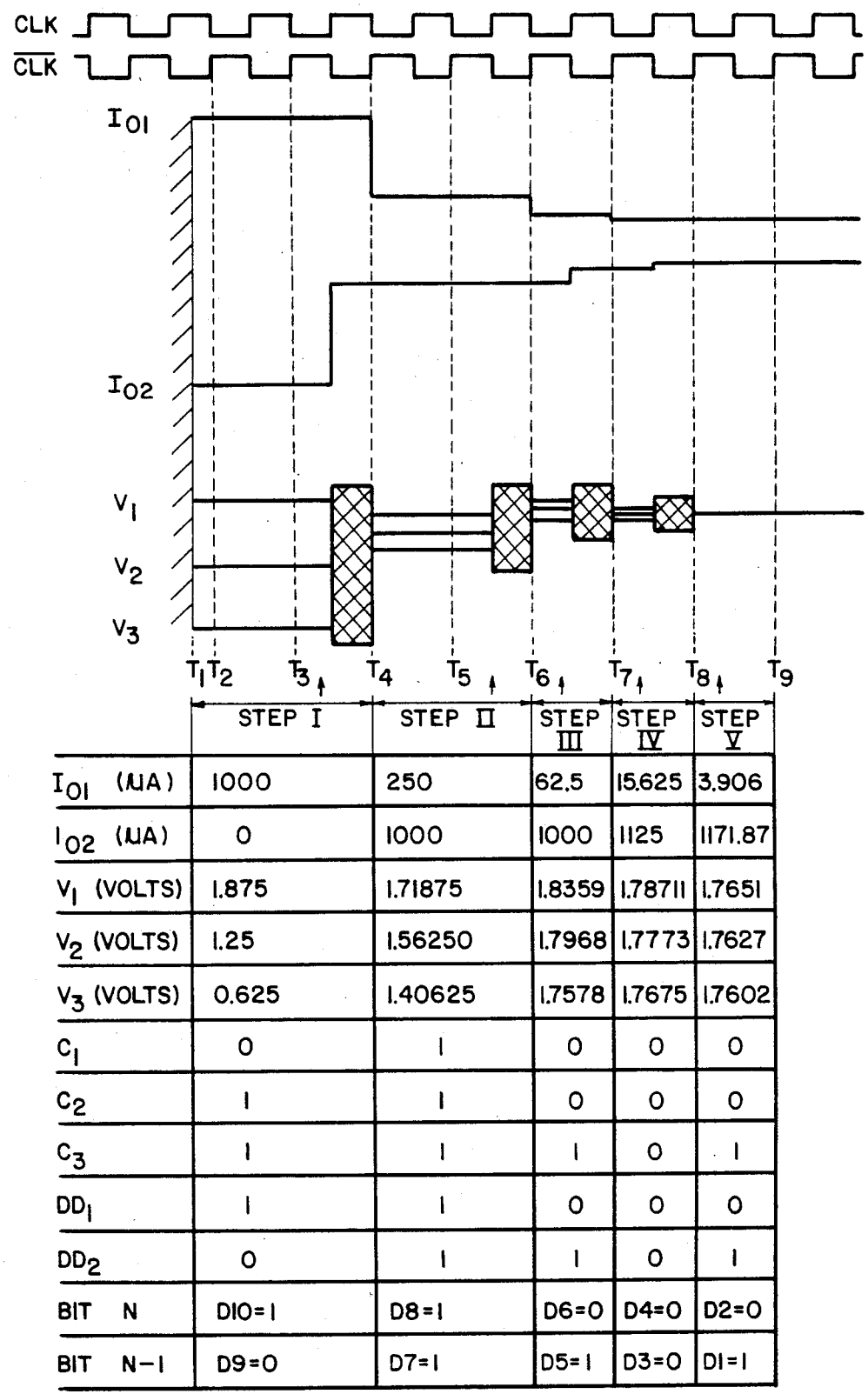

The operation of the SAR 14 can be readily understood by consideration of the timing diagram in FIG. 5, which will serve as a basic explanation thereof. The shift register (flipflops 56–61) provides the proper timing sequence for latching the data bits (DD1 and DD2) from the decoder into the data latches (flipflops 62–71). The data latch outputs $D_{10}$–$D_1$ directly drive the output buffers.

The SAR operates to decode the input signals applied to it thereby to provide the output signals labeled A-X which appear at terminals 87a–87x for selectively operating the switches (transistors 23) in the DAC 12. The SAR is preferably implemented in current mode logic.

At time $T_1$ on the timing diagram, FIG. 5, the $\overline{START}$ input waveform goes negative and the SPA and SPB waveforms each go positive, whereby all of the shift register flipflops are set so that the Q outputs are a logical "1" and the $\overline{Q}$ outputs are a logical "0". Thus, the $Q_4$–$Q_8$ outputs of flipflops 56–60 go positive and the $\overline{Q}_9$ of flipflop 61 goes negative at time $T_1$. The positive going edge of the SPA signal at terminal 82 produces the negative going edges of the waveforms $N_5$–$N_8$ at the outputs of NOR gates 72–75. Since at least one input to each of NOR gates 76–79 is high at time $T_1$, therefore the NOR gate output waveforms $N_1$–$N_4$ are all low.

Prior to time $T_1$, the comparators 2–4 ($C_1$–$C_3$), decoder 13 (DD1, DD2), data latches ($D_{10}$–$D_1$) and AND gates 110–115 outputs are in particular states determined by the last conversion cycle, which is indicated by the diagonal lines on the waveform diagram. Since comparators 2–4 only respond when the $\overline{CLK}$ waveform goes high, they remain in the same state because time $T_1$ occurs somewhere in the middle of a clock pulse. Also at time $T_1$, the data latches 62–69 ($D_{10}$–$D_3$) assume the state where the D outputs are positive (logic one) and the $\overline{D}$ outputs are negative (logic 0), since DD1 and DD2 are both in a low state.

The foregoing causes the transistor switches in DAC 12 to be switched so that current bits $I_{10}$ and $I_9$ are switched to output line $\overline{I_0}$ and all of the remaining current bits are switched to output line $I_{01}$. As a result, the voltages at tap points 9, 10 and 11 are $V_1 = 1.875V$, $V_2 = 1.25V$ and $V_3 = 0.625V$, respectively (with each resistor 5, 6 and 7 having a resistance R = 625 ohms). At time $T_2$, the $\overline{CLK}$ signal goes high, whereby comparators 2–4 (waveforms $C_1$–$C_3$) can now respond to the voltage levels established at their input terminals. For the assumed value of $V_{in} = 1.761V$, the output of comparator 2 (waveform $C_1$ in FIG. 5) will now be low (logic 0), whereas the outputs of comparators 3 (waveform $C_2$) and 4 (waveform $C_3$) are each high (logic 1). Therefore, in accordance with the decoder truth table, since $C_1 = 0$, $C_2 = 1$ and $C_3 = 1$, the output DD1 is primed to go high (logic 1) and output DD2 is primed to go low (logic 0). At time $T_3$ the SPB signal goes low at terminal 55 of decoder 13, releasing the decoder so output DD1 then goes high (logic 1).

The time period between $T_1$ and $T_3$ is provided to give time for the currents to settle in the DAC 12. During this period, the SPA signal goes low, whereupon NOR gate outputs $N_5$–$N_8$ all go high because the SPA input and the $N_1$–$N_4$ inputs to NOR gates 72–75 are then all at logic 0.

The positive edge of the clock pulse at time $T_3$ latches the comparators 2–4 so that they can no longer respond to changes in the analog input voltage, $V_{in}$. Also at $T_3$, the decoder 13 is released so that it can respond to the output signals of the comparators. On the negative edge of the next $\overline{CLK}$ signal, output $N_1$ of NOR gate 76 goes high and so the output $N_5$ of NOR gate 72 goes low. This enables flip-flops 62 and 63 so that these Data Latches for bits $D_{10}$ and $D_9$ can now respond to the signals DD1 and DD2 from the decoder received at terminals 80 and 81. The waveforms $D_{10}$ and $D_9$ are now high (logic 1) and low (logic 0), respectively.

At this time, none of the other data latches can respond because output terminals $N_6$, $N_7$ and $N_8$ of NOR gates 73, 74, and 75, respectively, are all still in the high (logic 1) state. Since the $D_9$ output is low and the $\overline{D}_9$ of data latch 63 is high, (see waveforms B and D) the left-hand transistor 23 connected to output line $I_9$ in DAC 12 is cut-off and the right-hand transistor connected to output line $I_9$ is conductive. As a result, the current $I_9$ (1 ma) is now switched over from output line $\overline{I_0}$ to output line $I_{02}$ of the DAC 12. Also, as output D10 is high, the left hand transistor 23 coupled to current bit line $I_{10}$ is still conductive so that the current $I_{10}$ still flows in output line $\overline{I_0}$. This does not affect comparator output waveforms $C_1$, $C_2$ and $C_3$ since the comparators 2–4 are in the latch mode. At time $T_4$, the $\overline{CLK}$ waveform goes positive, driving NOR gate 76 to produce a logic 0 at output terminal $N_1$, which in turn allows NOR gate 72 to produce a logic 1 signal at output $N_5$ since both of its inputs, $N_1$ and SPA, are both logic 0 (low) at $T_4$. The data bits DD1 and DD2 are now latched into the $D_{10}$ and $D_9$ Data Latches 62 and 63, respectively. This completes step 1 with $DD_1 = D_{10} = 1$ and $DD2 = D_9 = 0$ stored in flip-flops 62 and 63 and, via the flip-flop output lines, coupled to the $D_{10}$ and $D_9$ stages of the output buffer 15 and stored therein.

At time $T_4$, the negative edge of the CLK signal at terminal 85 causes the logic 0 signal at terminal 86 (D-input of flip-flop 56) to appear at the $Q_4$ output of flip-flop 56, i.e. the $Q_4$ waveform goes low (logic 0). As a result, output lines 87e and 87h of SAR 14 go negative, which cuts off the right-hand transistors of each group of three transistors 23 connected to current bit lines $I_8$ and $I_7$ in DAC 12. At this time, the $D_8$ outputs of data latch flip-flop 64 and 65 are each low (logic 0) so that the middle transistors 23 connected to current bit lines $I_8$ and $I_7$ in DAC 12 are also cut off. However, since the $\overline{Q}_4$ output of flip-flop 56 is high, as are the $D_8$ and $D_7$ outputs of flip-flops 64 and 65, AND gates 80 and 81 each have a logic 1 (high) output. The outputs of gates 80 and 81 (waveforms F and I) are coupled to the left-hand transistors 23 of current bit lines $I_8$ and $I_7$, respectively, which makes these transistors conductive. Therefore, the current bits $I_8$ and $I_7$ in DAC 12 are switched from output line $I_{01}$ to output line $\overline{I_0}$.

In step 2 of the conversion cycle, the $\overline{D}_{10}$ output of data latch 62 is low (logic 0) and the $\overline{D}_9$ output of data latch 63 is high (logic 1), see waveforms B and D.

Therefore, the right transistor of the pair of transistors 23 connected to current bit line $I_9$ in the DAC 12 will conduct so that the current $I_9$ flows in output line $I_{02}$. Also, as mentioned above, since output $D_{10}$ is high, the current $I_{10}$ still flows in output line $\bar{I_0}$. Step 2 now sees $\bar{I_0} = I_{10} + I_{10} + I_8 + I_7 = 1\text{ma} + 0.5\text{ma} + 0.25\text{ma} = 1.75\text{ma}$. Also, $I_{02} = I_9 = 1\text{ma}$ and $I_{01} = I_1 + I_2 \ldots + I_6 + I_t = 0.25\text{ma}$. As a result, the voltages at tap points 9, 10 and 11 are $V_1 = 1.71875\text{V}$, $V_2 = 1.5625\text{V}$ and $V_3 = 1.40625\text{V}$, respectively.

The time period between $T_5$ and $T_6$ is similar to the time period $T_3$–$T_4$. The comparators are latched on the positive edge of the clock signal. Since $V_{in} > V_1 > V_2 > V_3$, $C_1 = 1$, $C_2 = 1$ and $C_3 = 1$. From the decoder Truth Table, $DD1 = 1$ and $DD2 = 1$. On the negative edge of waveform $N_6$, the $D_8$ and $D_7$ data latches (flip-flops 64 and 65) are enabled. Since both $D_8$ and $D_7$ are logic "1", no change in $I_{02}$ occurs. The positive edge of waveform $N_6$ latches $D_8$ and $D_7$ to complete step 2.

In a manner similar to that occurring at time $T_4$, at time $T_6$ the negative edge of the CLK signal at terminal 85 causes the Q and $\bar{Q}$ outputs of flip-flop 58 to change state i.e. $Q_6 = 0$ and $\bar{Q_6} = 1$. As a result of which, the current bits $I_6$ and $I_5$ of DAC 12 are switched from output line $I_{01}$ to output line $\bar{I_0}$, reducing $I_{01}$ to 0.0625ma, changing the voltages at tap points 9, 10 and 11 to $V_1 = 1.83594\text{V}$, $V_2 = 1.79688\text{V}$ and $V_3 = 1.75781\text{V}$, respectively. There is no additional time provided for the DAC currents to settle. The time period $T_6$–$T_7$ is similar to the time periods $T_3$–$T_4$ and $T_5$–$T_6$. The comparators are again latched on the positive edge of the clock signal and since $V_1 > V_2 > V_{in} > V_3$, then $C_1 = 0$, $C_2 = 0$ and $C_3 = 1$. From the Truth Table, decoder outputs $DD1 = 0$ and $DD2 = 1$. On the negative edge of waveform $N_7$, the $D_6$ and $D_5$ data latches 66 and 67 are enabled so that current bit $I_6$ is now switched to output line $I_{02}$. The comparator outputs cannot change since they are in the latched mode. Therefore, $I_{02} = I_9 + I_6 = 1.125\text{ma}$. The positive (rising) edge of waveform $N_7$ latches $D_6$ and $D_5$ and so completes step 3.

Similar to time points $T_4$ and $T_6$, at time $T_7$ the current bits $I_4$ and $I_3$ of DAC 12 are switched from output line $I_{01}$ to output line $\bar{I_0}$, reducing the current $I_{01}$ to 0.015625ma and the voltages at tap points 9, 10 and 11 to $V_1 = 1.78711\text{V}$, $V_2 = 1.77734\text{V}$ and $V_3 = 1.76758\text{V}$, respectively. The time period $T_7$–$T_8$ is similar to the time periods $T_3$–$T_4$, $T_5$–$T_6$ and $T_6$–$T_7$. Since $V_1 > V_2 > V_3 > V_{in}$, the comparator outputs are $C_1 = 0$, $C_2 = 0$ and $C_3 = 0$, which are latched on the positive edge of CLK. From the decoder Truth Table, $DD1 = 0$ and $DD2 = 0$. On the negative edge of waveform $N_8$, the $D_4$ and $D_3$ Data Latches are enabled. Since $D_4 = 0$ and $D_3 = 0$, current bits $I_4$ and $I_3$ are switched to output line $I_{02}$, i.e. $I_{02} = I_9 + I_6 + I_4 + I_3 = 1.171875\text{ma}$. The comparator outputs cannot change since they are in a latched mode. The positive going edge of waveform $N_8$ latches $D_4$ and $D_3$ to complete step 4.

Similar to time points $T_4$, $T_6$ and $T_7$, at time $T_8$ the current bits $I_2$ and $I_1$ of DAC 12 are switched from output line $I_{01}$ to output line $\bar{I_0}$, thereby reducing the current $I_{01}$ to the termination current, $I_T = 0.00390625\text{ma}$. The voltages at tap points 9, 10 and 11 are now $V_1 = 1.76514\text{V}$, $V_2 = 1.7627\text{V}$ and $V_3 = 1.76025\text{V}$, respectively. Since $V_1 > V_2 > V_{in} > V_3$, the comparator outputs are $C_1 = 0$, $C_2 = 0$ and $C_3 = 1$, which are latched on the positive edge of CLK. The decoder truth table shows $DD1 = 0$ and $DD2 = 1$ for these values. On the positive edge of the of $Q_9$ flip-flop 61, the data bits $D_2$ and $D_1$ are latched to complete step 5.

The output $Q_8$ of flip-flop 60 is coupled to the control logic module which, in response thereto, produces the $\overline{EOC}$ signal indicating the end of a conversion cycle.

Figure 6:
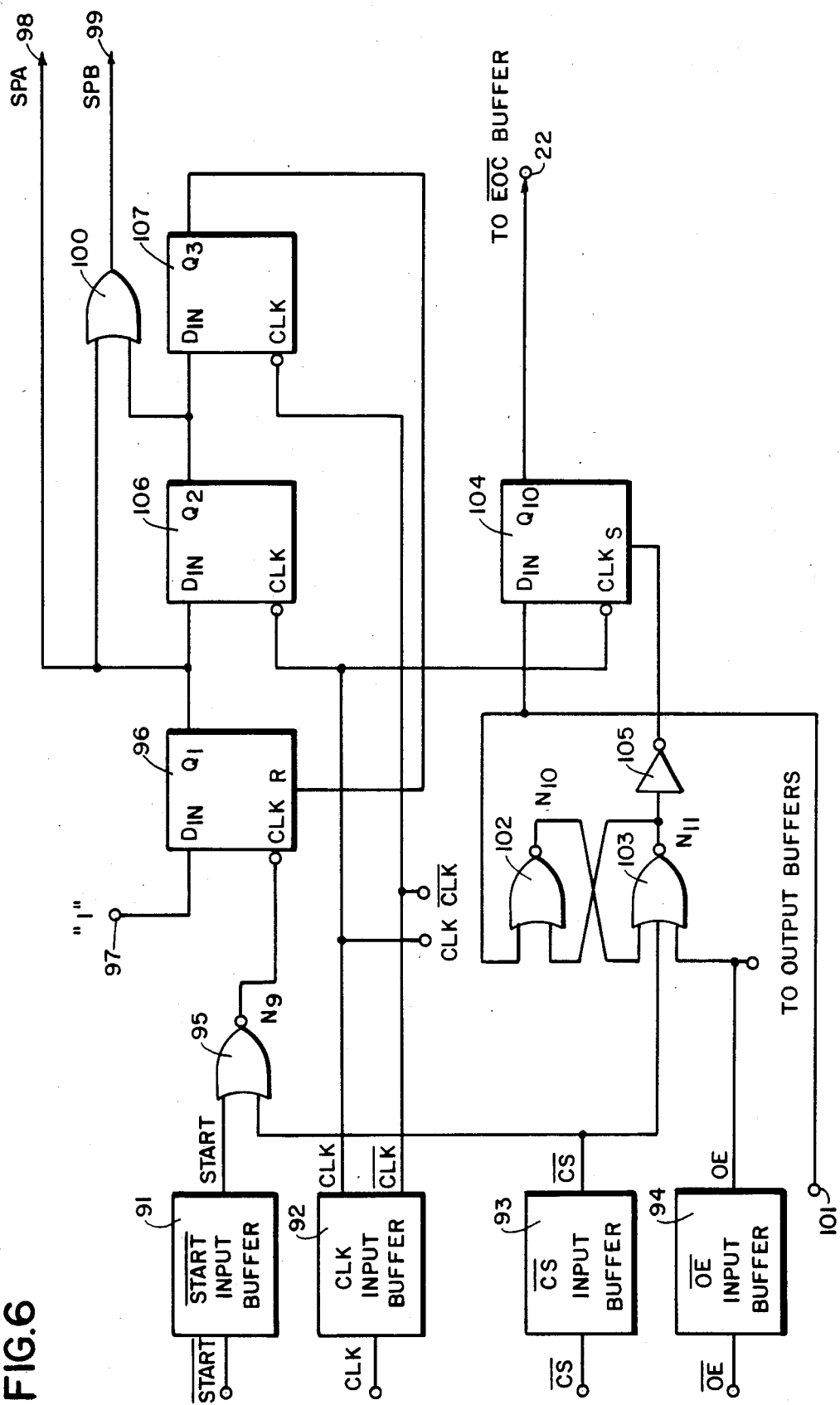
FIG. 6 is a block diagram of the control logic module of FIG. 1.
Figure 7:
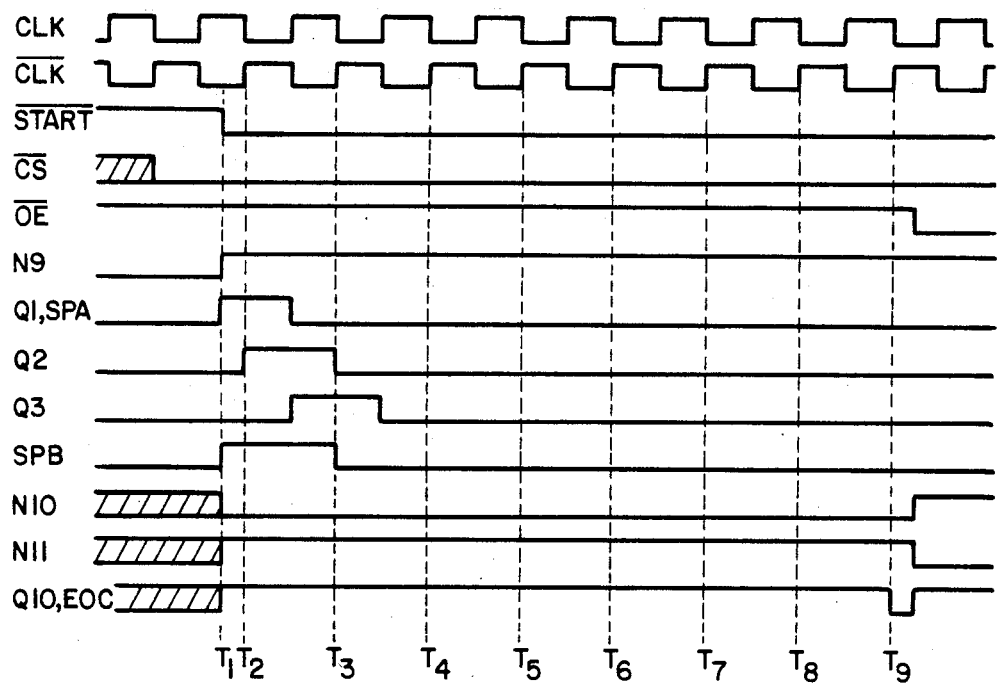
FIG. 7 is a timing waveform diagram useful in describing the operation of the logic of FIG. 6.

FIG. 6 is a block schematic diagram of the control logic module 19 and FIG. 7 is a timing diagram useful in explaining the operation of FIG. 6. The $\overline{START}$, CLK, $\overline{CS}$, $\overline{OE}$ control signals are applied to input buffer stages 91, 92, 93 and 94, respectively. The input buffers convert the standard TTL level signals to the internal logic levels of the A/D converter. They also generate the complement of the signal, i.e. the CLK input buffer 92 generates two complementary signals for internal use, CLK and $\overline{CLK}$.

The CLK input provides the system clock connection. When the $\overline{START}$ input signal goes to a low level, the conversion process is started. A high level input at the $\overline{CS}$ input will inhibit the system from responding to a $\overline{START}$ signal pulse and thereby prevent a conversion from taking place. A low level signal $\overline{OE}$ enables the output buffers and a high level $\overline{OE}$ signal forces the output buffers into a 3-state mode.

At time $T_1$, the $\overline{START}$ waveform goes low (logic 0). Since the $\overline{CS}$ waveform is then also low, the output $N_9$ of NOR gate 95 goes high (logic 1). The logic 1 signal at terminal $N_9$ triggers flip-flop 96 at its CLK input so that the logic "1" permanently coupled to the $D_{in}$ terminal from terminal 97 sets the flip-flop so that the $Q_1$ output goes high. The $Q_1$ output of flip-flop 96 provides the SPA signal at output terminal 98. The $Q_1$ output is also applied to SPB output terminal 99 via OR gate 100, so the SPB and SPA waveforms both go positive when the $\overline{START}$ waveform goes negative.

At the same time, input terminal 101 receives a logic 1 signal from the $Q_8$ output of flip-flop 60 in SAR 14 (see FIGS. 4 and 5). The logic 1 signal at terminal 101 produces a logic 0 signal at output terminal $N_{10}$ of NOR gate 102. Since the OE and $\overline{CS}$ inputs to NOR gate 103 are now also at logic 0, output $N_{11}$ of this gate goes high (logic 1). This produces a logic 0 signal at the Set input of D-type flip-flop 104 via an inverter 105.

At time $T_2$, the CLK signal from buffer 92 triggers the CLK input of D-type flip-flops 106 and 104. Since the $Q_1$ output of flip-flop 96, connected to the D-input of the flip-flop 106 is in a high-state (logic 1), the $Q_2$ output of flip-flop 106 goes high. Also, since the $Q_8$ output of flip-flop 60 in SAR 14 (see FIGS. 4 and 5) is in a high state and is connected to the D input of flip-flop 104, the $Q_{10}$ output of flip-flop 104 goes high.

At the next negative going edge of the $\overline{CLK}$ signal from CLK buffer 92, the D-type flip-flop 107 transfers the logic 1 signal at its input $D_{in}$ to output $Q_3$, i.e. output $Q_3$ goes high. The logic 1 signal at $Q_3$ is coupled to the Reset input of flio-flop 96, which is immediately reset. The $Q_1$ output of flip-flop 96, and hence the SPA signal, goes low when output $Q_3$ of flip-flop 107 goes high. However, the SPB signal remains high as it still receives the logic 1 signal from the $Q_2$ output of flip-flop 106, via OR gate 100.

As the input $D_{in}$ of flip-flop 106 is now low, the next negative edge of the CLK signal causes flip-flop 106 to switch over and cause output $Q_2$ to go low. This occurs at time $T_3$ and causes the SPB waveform to go low. At the next negative going edge of the $\overline{CLK}$ signal, the flip-flop 107 transfers the logic 0 signal at its D$_{in}$ input to its Q$_3$ output, so waveform Q$_3$ goes low.

At time T$_8$, the Q$_8$ output of flip-flop 60 in SAR 14 goes low (see FIG. 5), so terminal 101 goes to logic 0. Since output terminal N$_{11}$ of NOR gate 103 is still a logic 1, the output N$_{10}$ of NOR gate 102 remains at logic 0. However, the D$_{in}$ terminal of flip-flop 104 is now at logic 0. The next negative edge of the CLK signal occurs at time T$_9$ and triggers flip-flop 104 so that its Q$_{10}$ output goes negative. This is the $\overline{EOC}$ signal and it is transferred via output terminal 22 to the $\overline{EOC}$ buffer stage in output buffer 15, thus signalling the end of conversion.

After the $\overline{EOC}$ signals the end of the conversion, at a time determined by the user, the $\overline{OE}$ input is set to a logic 0. The OE signal goes to a logic 1. This releases the output buffers from the three-state (high impedance) condition so that the output buffers are enabled and the result of the A/D conversion appears at the output terminals of the A/D converter. Since the OE line is connected to the input of NOR gate 103 its output N11 goes to logic 0. This output is connected to the input of NOR gate 102. The other input of NOR gate 102 is connected to terminal 101 which receives a logic 0 signal from the Q$_8$ output of flip-flop 60 in SAR 14 (see FIGS. 4 and 5). Since both inputs of NOR gate 102 are logic 0, the output N10 of this gate goes to logic 1. The logic 0 signal at the output of gate 103 produces a logic 1 signal at the set input of flip-flop 104 via the inverter 105. The Q$_{10}$ output of flip-flop 104 therefore goes to logic 1, which is transferred via terminal 22 to the $\overline{EOC}$ buffer stage. This puts the A/D converter in a state suitable for the next conversion to take place.

Although the invention has been described in connection with a particular preferred embodiment thereof, it will be apparent that various other embodiments and modifications thereof will become obvious to persons skilled in the art. For example, while I have described my A/D converter as a 10-bit converter in which the analog input signal is converted into digital form in five steps, with two bits converted per step, it will be clear that with suitable modifications of the apparatus in accordance with the above disclosure, more than two bits can be converted in each step, and more or less steps can be used to provide a complete conversion cycle. The scope of the invention is therefore to be limited only by the appended claims and not by the specific details of the preferred embodiment described herein.

In the timing diagrams of FIG. 5, the cross-hatched areas for the voltages V$_1$, V$_2$ and V$_3$ indicate that these voltages are at an intermediate value which is then irrelevant. The values shown in the Table of FIG. 5 occur at the points in time indicated by the vertical arrows at the top of the Table. Prior to time T$_1$, the values of I$_{01}$, I$_{02}$, V$_1$, V$_2$ and V$_3$ are determined by the results of a previous conversion cycle.

What is claimed is:

1. A successive approximation A/D converter comprising: an input terminal for receiving an analog signal voltage to be converted into a corresponding digital representation, a switchable current source having first and second output current lines, a resistor chain voltage divider coupled to said switchable current source output lines for developing a plurality of reference voltages that subdivide the input voltage siqnal range into a plurality of voltage subranges, means coupling a source of reference voltage to said switchable current source and to said voltage divider, means for comparing said resistor chain reference voltages with the analog signal voltage at the input terminal thereby to derive a plurality of control signals indicative of the voltage subrange which contains the analog voltage at the input terminal, a decoder having input means responsive to said derived control signals to develop at least first and second binary control signals which represent first and second digits of the digital signal corresponding to the analog input voltage at the input terminal, means responsive to said decoder first and second binary control signals for controlling said switchable current source so as to readjust the currents in said output lines in a manner determined by said first and second binary control signals whereby the resistor chain develops a second plurality of reference voltages indicative of a second narrower voltage subrange which contains the analog voltage at the input terminal, means for storing said first and second binary control signals, and a control logic device responsive to a start signal and having output means coupled to said controlling means for initiating a conversion cycle of the A/D converter and for providing control pulses thereto to control its operation.

2. An A/D converter as claimed in claim 1 wherein said switchable current source comprises: a plurality of binary weighted current sources, and a plurality of controlled switches for selectively coupling said current sources to said first and second output current lines during successive steps in an A/D conversion cycle and as a function of a plurality of switching signals applied to control electrodes of said switches by said controlling means and determined by the first and second binary control signals derived during the preceding step in said conversion cycle.

3. An A/D converter as claimed in claim 1 wherein said switchable current source comprises a digital-to-analog converter providing a current output.

4. An A/D converter as claimed in claim 1 wherein said resistor chain includes at least three serially connected equal value resistors having first and second end terminals coupled to said source of reference voltage and to said first output current line, respectively, said switchable current source having a third output current line with said second and third output current lines coupled to respective first and second tap points on the resistor chain, and wherein said comparing means includes at least first, second and third comparators having one input coupled to the input terminal and second inputs respectively coupled to tap points on the resistor chain such that an equal progression of reference voltages is supplied to the second inputs of the first, second and third comparators whereby output signals of the comparators determine the voltage subrange which contains the analog input voltage.

5. An A/D converter as claimed in claim 1 wherein said switchable current source comprises a digital-to-analog converter having said first and second output current lines and a third output current line and said resistor chain includes at least three serially connected equal value resistors having first and second end terminals coupled to said source of reference voltage and to said first output current line, respectively, and said second and third output current lines are coupled to a first tap point on the resistor chain and to said first end terminal thereof, respectively, said resistor chain having at least three tap points at which said reference voltages are developed, and wherein the digital-to-analog converter comprises a plurality of current sources individually coupled to three-position semiconductor controlled switches that selectively couple the respective current sources to said first, second and third output current lines to readjust the current flow through the resistor chain at each step of the conversion cycle so as to develop a new set of reference voltages at each step thereby to progressively narrow the voltage subrange step-by-step in a conversion cycle and as a function of the decoder first and second binary control signals supplied to the controlling means.

6. An A/D converter as claimed in claim 1 wherein said switchable current source comprises a single current output digital-to-analog converter for readjusting the reference voltages developed by the resistor chain at each step of an analog/digital conversion cycle by switching the currents in said first and second output current lines as a function of the first and second binary control signals derived in a preceding step of said conversion cycle.

7. An A/D converter as claimed in claim 6 wherein said resistor chain and said comparing means produce four voltage subranges during each step of a conversion cycle, each successive voltage subrange covering one fourth of the voltage range of the subrange in the preceding step.

8. An A/D converter as claimed in claim 1 wherein the resistor chain comprises 3 serially connected equal value resistors with one end terminal of the resistor chain coupled to said source of reference voltage and a second end terminal of the resistor chain coupled to the first output current line, said second output current line being coupled to an intermediate tap point on the resistor chain and a third output current line of the current source being coupled to said one end terminal of the resistor chain, and wherein said controlling means controls the switchable current source so that the current flow in said second current line in any step of a conversion cycle is equal to the sum of the bit currents for which the value of said first or second binary control signals was a logic zero in any preceding step of the conversion cycle.

9. An A/D converter as claimed in claim 1 wherein said switchable current source further comprises a third output current line coupled to said source of reference voltage and said resistor chain with the current therein controlled by said controlling means so that a constant load is maintained on said source of reference voltage.

10. An A/D converter as claimed in claim 1 wherein said switchable current source further comprises: a third output current line coupled to the resistor chain, a plurality of current sources, and a plurality of controlled switches for selectively coupling said current sources to said first, second and third output current lines during successive steps in an A/D conversion cycle and as a function of a plurality of switching signals applied to control electrodes of said switches by said controlling means and determined by the first and second binary control signals derived during the preceding step in said conversion cycle.

11. An A/D converter as claimed in claim 1 wherein said resistor chain includes at least three serially connected resistors at least two of which have equal resistance values, said resistor chain having first and second end terminals coupled to said source of reference voltage and to said first output current line, respectively, and wherein said comparing means includes a plurality of comparators coupled to respective tap points on the resistor chain at which said reference voltages are developed.

12. A multi-step A/D converter comprising: an input terminal for an analog signal voltage, a switchable current source having first and second output current lines and means for switching currents to said output lines in accordance with a plurality of input control signals applied thereto, a resistor chain coupled to a source of reference voltage and to said output current lines and having a plurality of tap points for developing a series of reference voltages determined by the currents in said output current lines and with equal voltage increments between the tap points so as to define a voltage subrange that includes the analog signal voltage, means for comparing the reference voltages at said tap points with an analog voltage at said input terminal, a decoder coupled to an output of the comparing means for deriving first and second binary signals which represent first and second digits of a digital signal corresponding to the analog input voltage, means responsive to said decoder first and second binary signals for deriving and applying said plurality of control signals to the switchable current source, and means for supplying control pulses to said signal deriving means so that the currents in said output current lines are readjusted on a step-by-step basis as a function of the first and second binary signals derived during a preceding step of an A/D conversion cycle.

13. An A/D converter as claimed in claim 12 wherein said switchable current source further comprises: a third output current line, a plurality of current sources, and a plurality of controlled switches for selectively coupling said current sources to said first, second and third output current lines during successive steps in an A/D conversion cycle, and wherein said resist or chain includes at least three serially connected resistors at least two of which have equal resistance values.

14. An A/D converter as claimed in claim 12 wherein said switchable current source further comprises a third output current line coupled to the resistor chain and means for selectively switching the currents in said output lines as a function of the binary signals derived during a preceding step of an A/D conversion cycle whereby the reference voltages developed at the tap points on the resistor chain are readjusted at each step of a conversion cycle.

15. An A/D converter as claimed in claim 12 wherein said switchable current source comprises a single digital-to-analog converter providing output currents at said first and second output current lines determined by the decoder first and second binary signals derived during a preceding step of an A/D conversion cycle.

16. An A/D converter as claimed in claim 12 wherein said switchable current source comprises a plurality of current sources selectively coupled to said first and second output current lines as a function of the decoder first and second binary signals derived during a preceding step of an A/D conversion cycle.

17. An A/D converter as claimed in claim 12 wherein said resistor chain is directly connected to said source of reference voltage.

18. An A/D converter as claimed in claim 12 wherein the first and second output current lines of the switchable current source are coupled to tap points on the resistor chain and said control signal deriving means supplies control signals to the switchable current source such that the current in the second pturput current line selects the voltage subrange and the current in the first output current line sets the voltage range of each subrange in each step independently of the current in the second output current line.

* * * * *